United States Patent
Kang et al.

(10) Patent No.: US 7,688,646 B2
(45) Date of Patent: Mar. 30, 2010

(54) NON-VOLATILE LATCH CIRCUIT FOR RESTORING DATA AFTER POWER INTERRUPTION

(75) Inventors: Hee Bok Kang, Chungcheongbuk-do (KR); Suk Kyoung Hong, Gyeonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 130 days.

(21) Appl. No.: 12/134,309

(22) Filed: Jun. 6, 2008

(65) Prior Publication Data
US 2009/0190430 A1 Jul. 30, 2009

(30) Foreign Application Priority Data
Jan. 30, 2008 (KR) .................. 10-2008-0009611

(51) Int. Cl.
*G11C 7/00* (2006.01)
(52) U.S. Cl. .................. 365/189.05; 365/194; 365/233; 365/233.5
(58) Field of Classification Search ............ 365/189.05, 365/194, 233, 233.5
See application file for complete search history.

(56) References Cited

U.S. PATENT DOCUMENTS

| 5,592,411 A | | 1/1997 | Tai | |
|---|---|---|---|---|
| 5,668,760 A | * | 9/1997 | Hazen | ................. 365/189.14 |
| 6,381,191 B2 | * | 4/2002 | Ooishi | ................. 365/230.03 |
| 7,313,022 B2 | * | 12/2007 | Takeuchi et al. | ....... 365/185.09 |

FOREIGN PATENT DOCUMENTS

KR 1020070011744 A 1/2007

* cited by examiner

*Primary Examiner*—Son Dinh
(74) *Attorney, Agent, or Firm*—Ladas & Parry LLP

(57) ABSTRACT

A nonvolatile latch circuit that exhibits improved the performance of a system is presented. The nonvolatile latch circuit is capable of storing all kinds of the states generated during the operation of the system as non-volatility information. The nonvolatile latch circuit is capable of restoring the previous state where of power is unexpectedly interrupted when the system is re-booting. The present invention includes an input control unit, a data control unit, a storage control unit, a clock control unit, a data transition detecting unit, and a data output unit.

23 Claims, 24 Drawing Sheets

NON-VOLATILE LATCH CIRCUIT FOR RESTORING DATA AFTER POWER INTERRUPTION

CROSS-REFERENCE TO RELATED APPLICATION

The present application claims priority to Korean patent application number 10-2008-0009611, filed on 30 Jan. 2008, which is incorporated by reference in its entirety.

BACKGROUND OF THE INVENTION

The present invention relates generally to a nonvolatile latch circuit, and more particularly to a nonvolatile latch circuit for enhanced system performance by storing in a nonvolatile way many kinds of states generated during the system operations so that the stored non-volatile data are available to restore the system to the previous state in a case of re-booting.

FIG. 1 is a graph showing the power consumption pattern of a conventional chip as the chip's design rule (or "the technology node") generally indicative of the chip's integration density shrinks from 180 nm to 65 nm.

Referring to FIG. 1, when the technology node, which indicates the design rule of a conventional device is large (e.g., near the 180 nm technology node), the current consumption of an active current which is an operating current of System On a Chip (SOC) is expected to be larger than the current consumed by the device during a standby mode, i.e., the non-active state.

As the device size becomes smaller or the technology node as in FIG. 1 is scanned from 180 nm to 65 nm, the rising slop of the active current required is rather slow or gradual; however, the slope of the standby current drastically and abruptly increases at about 90 nm. This leads to the drastic increase of the leakage current component of the sub-threshold voltage Vt, which is a constituent of the non-switching current more drastic than the increase of the switching current, which is a main component of the active current. That is, as a device becomes smaller, the proportion of the current consumption in the standby mode is expected to significantly increase due to the leakage current passing through the CMOSs in the standby state.

Therefore, in the standby mode, finding ways to reduce the power consumption of a chip to limit or minimize the expected large amounts of power supplied to these highly integrated chips is desirable. At this time, the circuit that stores the previous conditions of the circuit and that is able to recall those previous conditions is required in order to recover the previous condition of the circuit before the power source to the circuit is interrupted.

A conventional circuit memorizing the prior state of the circuit when the power is off is a nonvolatile latch circuit shown in FIG. 2.

The conventional nonvolatile latch circuit provides a plurality of inverters IV1~IV8, NMOS transistor SW1, SW2, and a capacitor 10.

Here, the inverter IV1 is synchronized with the clock CK to invert data D. The latch R1 includes the inverters IV2, IV3 of the latch structure, while being synchronized with the clock/CK to latch the output of the inverter IV1. The inverter IV4 is synchronized with the clock/CK to invert the output of the latch R1. The latch R2 includes the inverter IV5, IV6 of the latch structure and latches the output of the inverter IV4 to output data Q.

In response to the switching signal SS, the NMOS transistors SW1, SW2 selectively connect the latch R1 and the capacitor 10. The capacitor 10 provides a plurality of nonvolatile ferroelectric capacitors FC1~FC4.

At this time, the nonvolatile ferroelectric capacitors FC1, FC2 store the output of the plate line/PL1 which is inverted by the inverter IV7. And, the nonvolatile ferroelectric capacitors FC3, FC4 store the output of the plate line/PL2 which is inverted by the inverter IV8.

The conventional nonvolatile latch circuit having such a circuit configuration is implemented in each circuit function region within the system on chip in order to store the non-volatile data representative of the turn-on state of the power supply switch when the power switch is turned off. Therefore the data are stored in the capacitor 10 through the additional latch R1, R2 before the power switch is turned off, or the previous data is restored when the power switch is turned on.

The conventional nonvolatile latch circuit as described above stores the state of the latch R1, R2 into the capacitor 10 during a storage unit period in entering the power off mode and restores the data stored in the latch R1, R2 during a recall period when entering the power on mode.

But, such a conventional nonvolatile latch circuit stores the previous data only in a preset power off mode. Therefore, problems arise in that the latch data in the active state is lost in the case when there is an occurrence of an accidental power off state during an active period. The will make recovery of the data impossible.

BRIEF SUMMARY OF THE INVENTION

The present invention provides improved system performance by storing all kinds of states generated during the operation of the system in a non-volatile way so that the previous state prior to power interruption can be restored after a subsequent re-booting.

A nonvolatile latch circuit includes, inter alia, an input control unit controlling data, a data control unit, a storage control unit, a clock control unit, a data transition, and a data output unit. The input control unit controls data according to a power on reset signal, in response to a data transition detection signal, and in response to a delay signal, and stores and latches the data as a non-volatile state according to a control signal. The data control unit selects one of an output and an input data of the input control unit according to the control signal, and outputs the delay signal synchronized with a clock enable signal. The storage control unit outputs the control signal according to the power on reset signal and in response to the data transition detection signal. The clock control unit outputs the clock enable signal in response to a clock, in response to a pull down enable signal, and in response to a pull up enable signal. The data transition detects unit outputting the data transition detection signal by detecting whether the delay signal transitions. The data output unit selectively outputs the output data according to the delay signal and in response to the latch output enable signal.

DESCRIPTION OF EMBODIMENTS

According to an embodiment of the present invention, there is provided a nonvolatile latch circuit comprising an input control unit controlling a data which is inputted in response to a power on reset signal, a data transition detection signal, and a delay signal, and storing and latching the data as a non-volatility state in response to a control signal; a data control unit selecting one of the output and the input data of the input control unit in response to the control signal, and outputting the delay signal synchronized with a clock enable signal; a storage control unit outputting the control signal in response to the power on reset signal, and the data transition detection signal; a clock control unit outputting the clock enable signal by controlling the control signal and the clock; a data transition detecting unit outputting the data transition detection signal by detecting whether the delay signal transitions; and a data output unit selectively outputting the output data in response to the delay signal and the latch output enable signal.

Hereinafter, the embodiments of the present invention will be described in detail with reference to the attached drawings.

Figure 1:
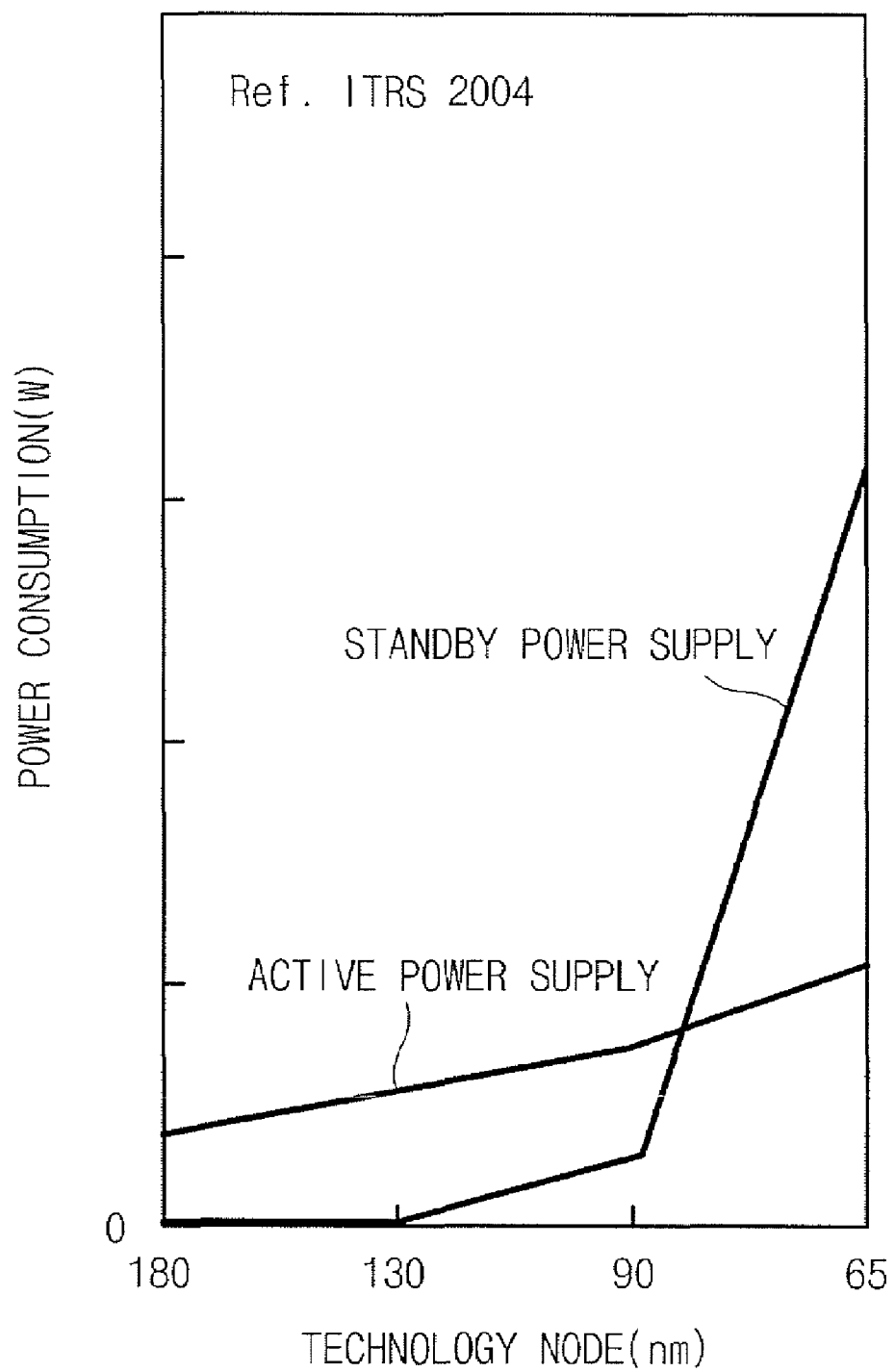
FIG. 1 is a graph for illustrating the changing power consumption pattern of a semiconductor chip corresponding to a scale of technology node (nm).
Figure 2:
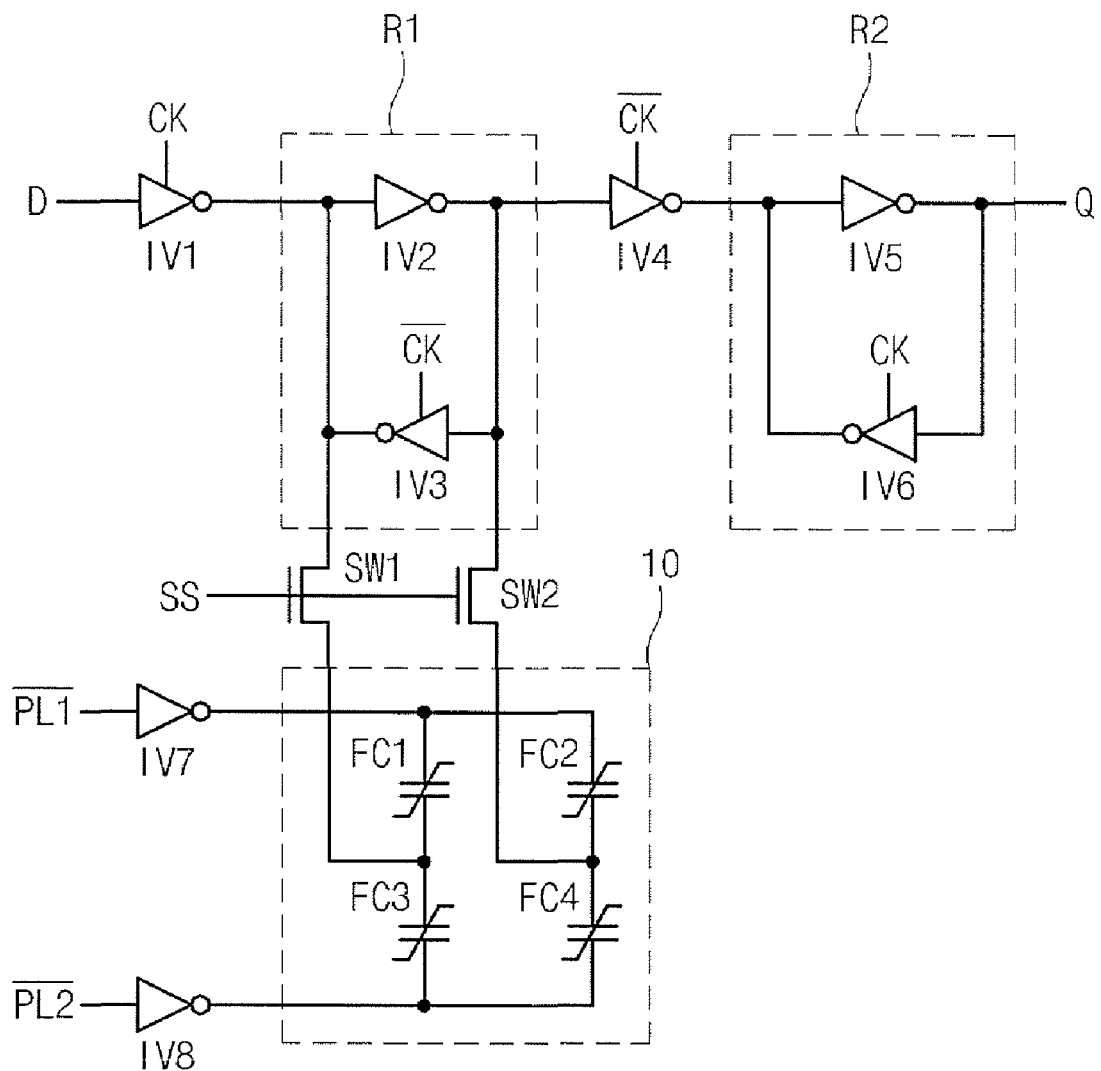
FIG. 2 is a circuit diagram of a conventional nonvolatile latch circuit.
Figure 3:
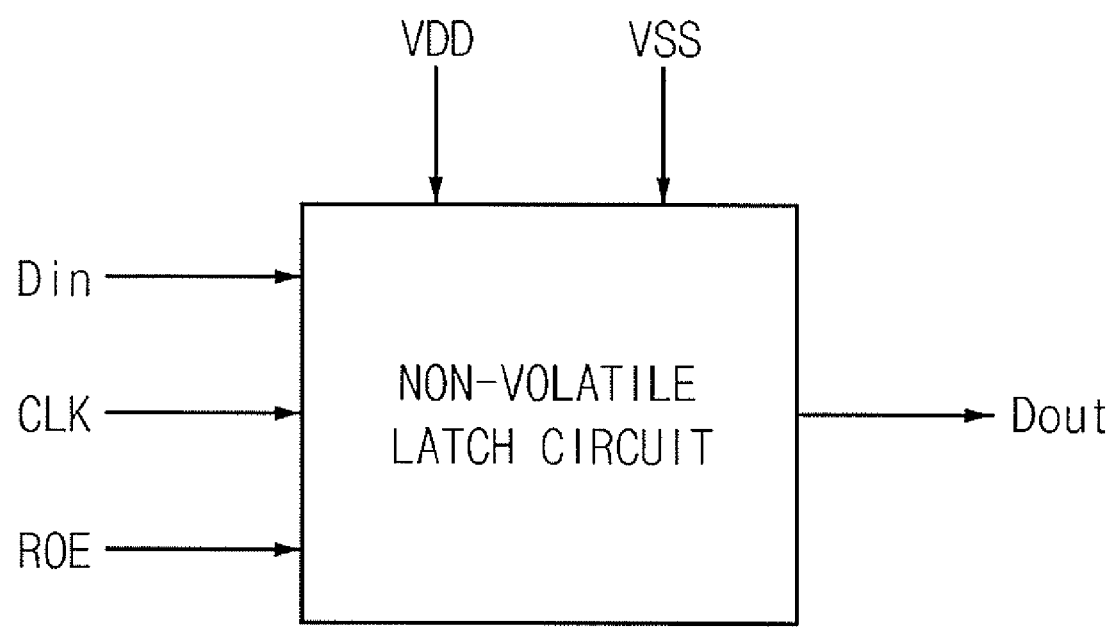
FIG. 3 is a configuration diagram showing the I/O status of a nonvolatile latch circuit according to an embodiment of the present invention.

FIG. 3 is a configuration diagram showing the I/O status of the nonvolatile latch circuit of the present invention.

In response to the clock CLK and the latch output enable signal ROE, the nonvolatile latch circuit according to an embodiment of the present invention latches the input data Din as non-volatility state to output the output data Dout. At this time, the nonvolatile latch circuit uses a power supply voltage VDD, and a ground voltage VSS as a power source.

The input data Din is stored in the nonvolatile latch circuit, while being synchronized with the high edge of the clock CLK. In the case when the power source is the turn on state, the storage unit status is continuously maintained and, another input data Din is stored in the nonvolatile latch circuit in the high edge of the next clock CLK.

In addition, the data stored in the nonvolatile latch circuit is outputted with the output data Dout by the latch output enable signal ROE, and delivered to the output pin. That is, in the case when the latch output enable signal ROE is at a high level, the data stored in the nonvolatile latch circuit is outputted with the output data Dout. On the other hand, in case the latch output enable signal ROE is at a low level, it is outputted with a floating high impedance (High-Z).

Figure 4:
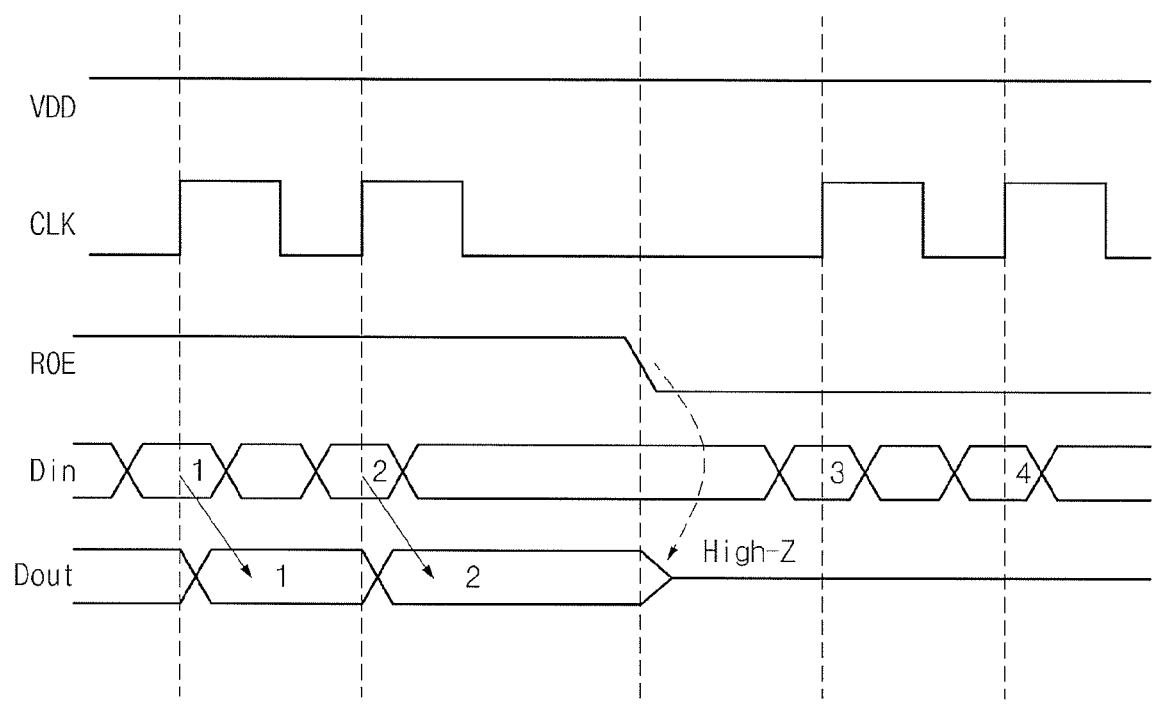
FIGS. 4-5 show the operational waveforms of the nonvolatile latch circuit of FIG. 3.
Figure 5:
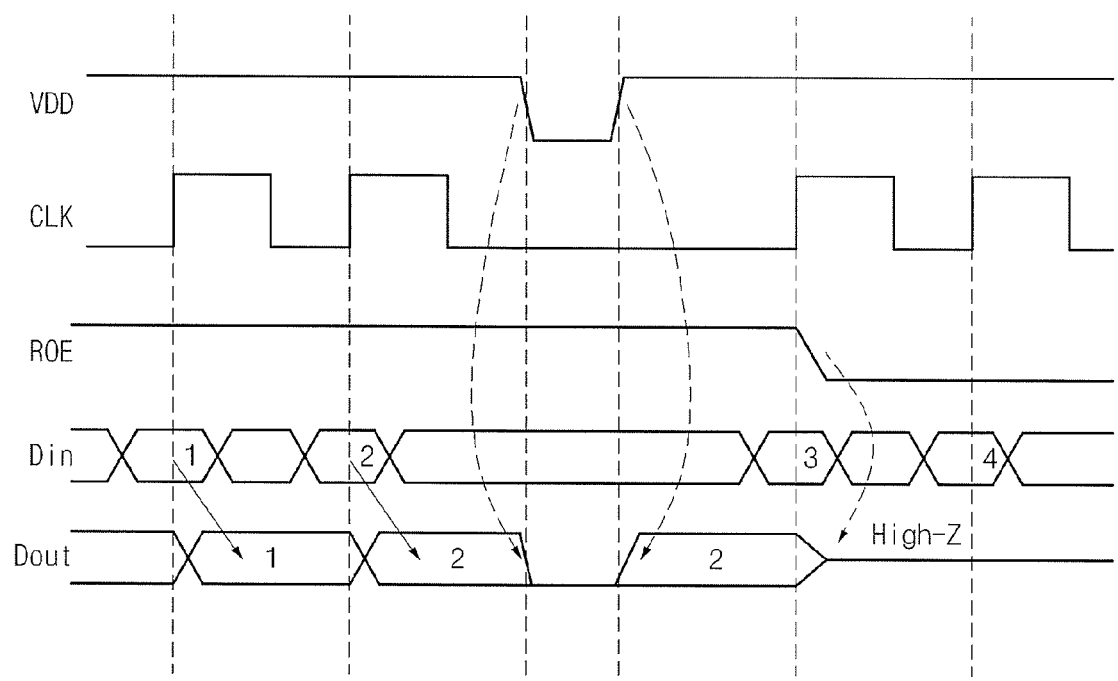

FIGS. 4 and 5 are an operation waveform of the nonvolatile latch circuit of FIG. 3.

Firstly, in the case when the power supply voltage VDD is maintained as shown in FIG. 4, while being synchronized with the high edge of the clock CLK, the input data Din is inputted and stored into the nonvolatile latch circuit. The nonvolatile latch circuit latches the input data Din, so that the state is continuously stored when the power source is maintained.

At this time, the nonvolatile latch circuit outputs the latched input data Din as the output data Dout in the period when the latch output enable signal ROE is activated with the high level. In the case when the latch output enable signal ROE is deactivated with the low level, the output data Dout is outputted with the high impedance (High-Z) state whether or not the input data Din is inputted.

On the other hand, when the power supply voltage VDD is turned off after being maintained as shown in FIG. 5, the output data Dout is not outputted during the period when the power supply voltage VDD is turned off. Thereafter, in the case when the power supply voltage VDD is turned on again, the data memorized in the nonvolatile latch circuit is restored and outputted with the output data Dout. For example, the data "2" which is a data before the power supply voltage VDD is turned off is restored to latch data "2".

Thereafter, in the period when the latch output enable signal ROE is activated with the high level, the input data Din is latched. In the case when the latch output enable signal ROE is deactivated with the low level, the output data Dout is outputted with the high impedance (High-Z) state whether or not the input data Din is inputted.

Figure 6:
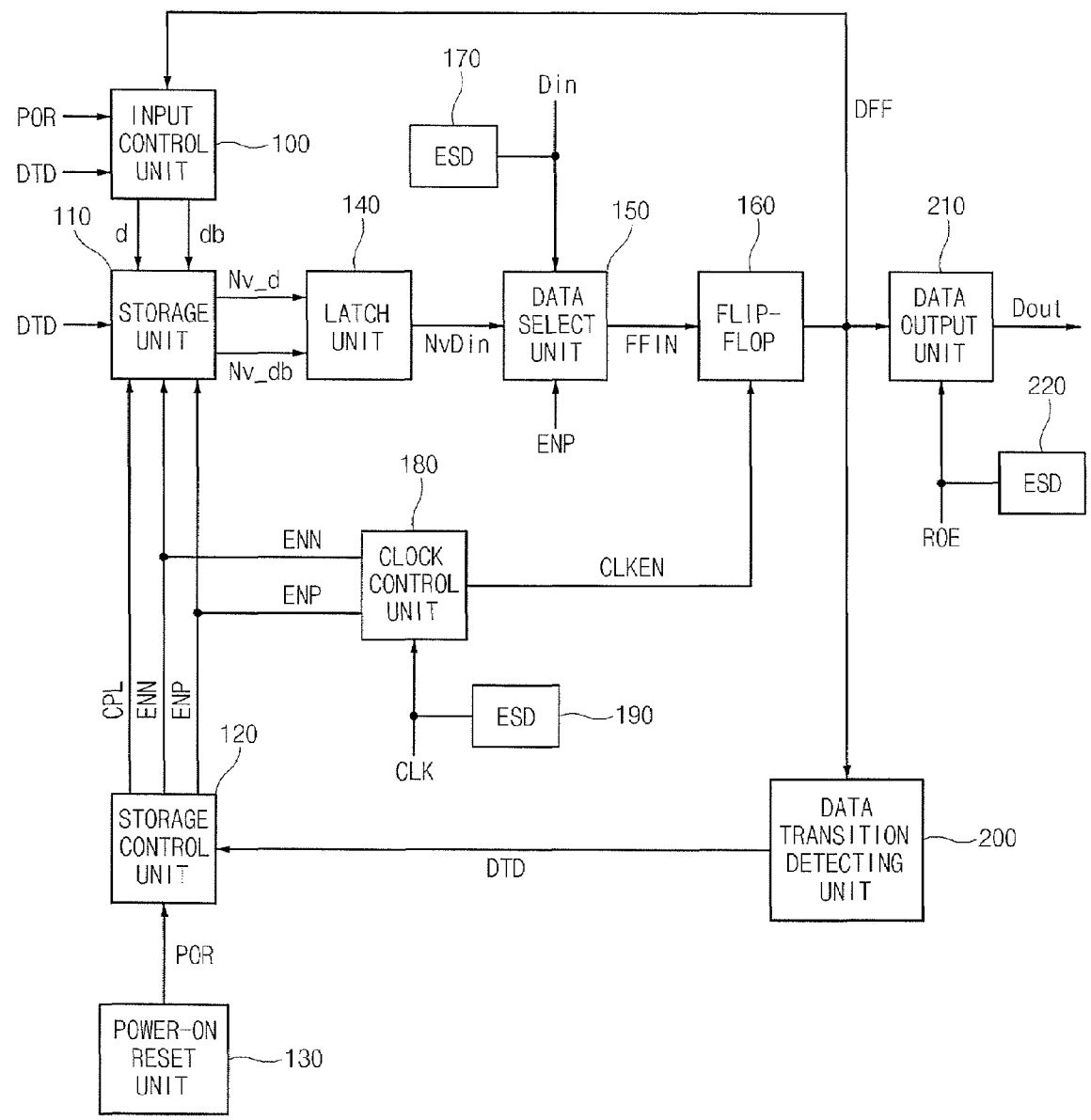
FIG. 6 is a block diagram of the nonvolatile latch circuit of FIG. 3.

FIG. 6 is a detailed configuration diagram of the nonvolatile latch circuit of FIG. 3.

An embodiment of the present invention includes an input control unit 100, a storage unit 110, a storage control unit 120, a power-on-reset unit 130, a latch unit 140, a data select unit 150, a flip-flop 160, an electro static discharge (ESD) unit 170, a clock control unit 180, an electrostatic discharge unit 190, a data transition detecting unit 200, a data output unit 210, and an electrostatic discharge unit 220.

Here, the input control unit 100, the storage unit 110 and the latch unit 140 will be illustrated as an input control unit. The data select unit 150, the flip-flop 160 will be illustrated as a data control unit.

In response to the power-on-reset signal POR, the data transition detection signal DTD, and the delay signal DFF, the input control unit 100 outputs data signals d, db. Here, the data signal db indicates the inversion signal of data d signal.

The storage unit 110 stores the data d, db signals as the corresponding non-volatility data Nv_d, Nv_db states in response to the data transition detection signal DTD, the cell plate signal CPL, the pull down enable signal ENN, and the pull up enable signal ENP, and outputs the corresponding non-volatile data Nv_d, Nv_db.

The storage control unit 120 outputs the cell plate signal CPL, the pull down enable signal ENN, and the pull up enable signal ENP, in response to the power on reset signal POR and in response to the data transition detection signal DTD. The power-on-reset unit 130 senses the power supply voltage and outputs the power on reset signal POR to the storage control unit 120.

The latch unit 140 latches the non-volatile data Nv_d, Nv_db and outputs the input data NvDin. In response the pull up enable signal ENP, the data select unit 150 selects one of the input data Din and the input data NvDin to output the flip-flop input FFIN signal.

The flip-flop 160 inputs the FFIN signal to be flip-floped to output the delay signal DFF in response to the clock enable signal CLKEN. The electrostatic discharge unit 170 performs the electrostatic discharge function of the input data Din. Accordingly, the electrostatic discharge unit 170 is an element that removes the high peak noise component of the input data Din signal in order to stabilize the voltage level of the Din signal.

In addition, the clock control unit 180 controls the clock CLK in response to the pull down enable signal ENN and in response to the pull up enable signal ENP in order to output the clock enable signal CLKEN. The electrostatic discharge unit 190 performs the electrostatic discharge function for the clock CLK. Accordingly, the electrostatic discharge unit 190 is an element that removes the high peak noise component of the clock CLK to stabilize the voltage level of the CLK signal.

The data transition detecting unit 200 senses the data transition in the delay signal DFF, and outputs the data transition detection signal DTD. In response to the delay signal DFF and to the latch output enable signal ROE, the data output unit 210 selectively outputs the output data Dout signal.

The electrostatic discharge unit 220 performs the electrostatic discharge function on the latch output enable signal ROE. That is, the electrostatic discharge unit 220 is an element for removing the high peak noise component of the latch output enable signal ROE in order to stabilize the voltage level of the ROE signal.

Figure 7:
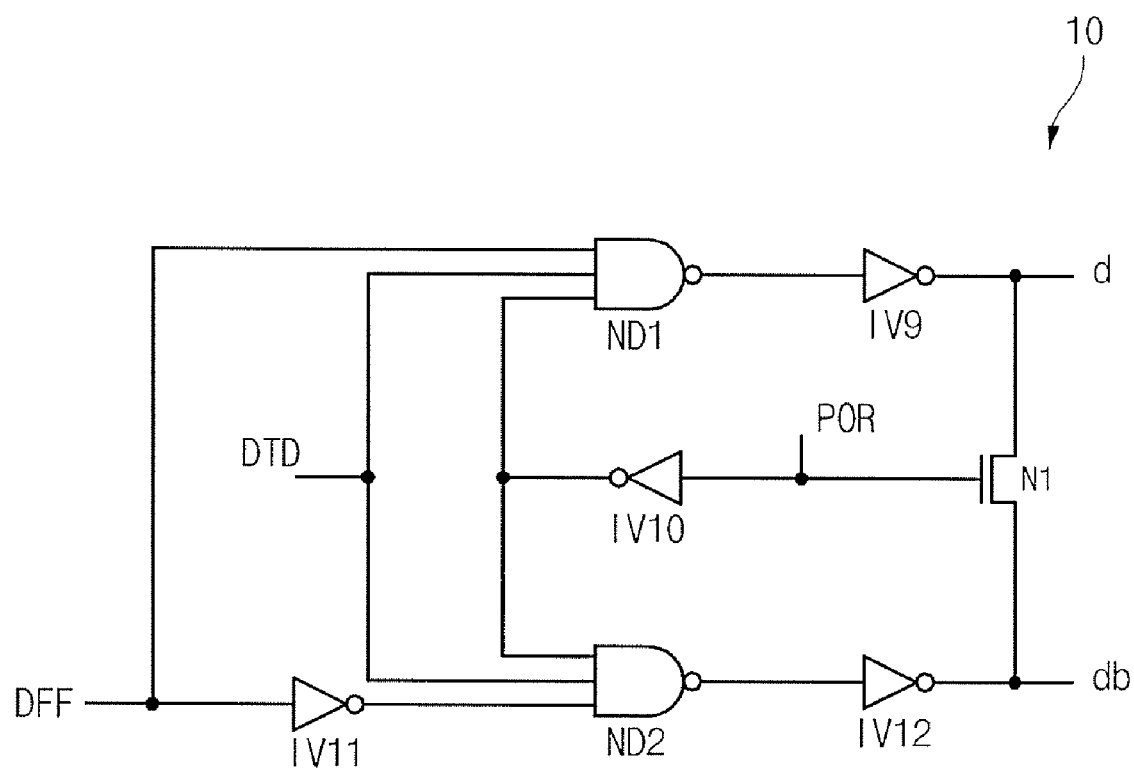
FIG. 7 is a circuit diagram of an input control unit of FIG. 6.

FIG. 7 is a detailed circuit diagram of an input control unit 100 of FIG. 6.

The input control unit 100 includes a plurality of NAND gates ND1, ND2, and a plurality of inverters IV9~IV12 and a NMOS transistor N1.

Here, the NAND gate ND1 performs a NAND operation on the delay signal DFF, on the data transition detection signal DTD, and on the power on reset signal POR inverted by the inverter IV10. The inverter IV9 inverts the output of the NAND gate ND1 and outputs the output data d. The NAND gate ND2 performs a NAND operation on the delay signal DFF inverted by the inverter IV11, on the power on reset signal POR inverted by the inverter IV10 and on the data transition detection signal DTD. The inverter IV12 inverts the output of the NAND gate ND2 and outputs the data db. The NMOS transistor N1 is connected between a data d output terminal and a data db output terminal, while the gate of the NMOS transistor N1 is connected to the power on reset signal POR.

Figure 8:
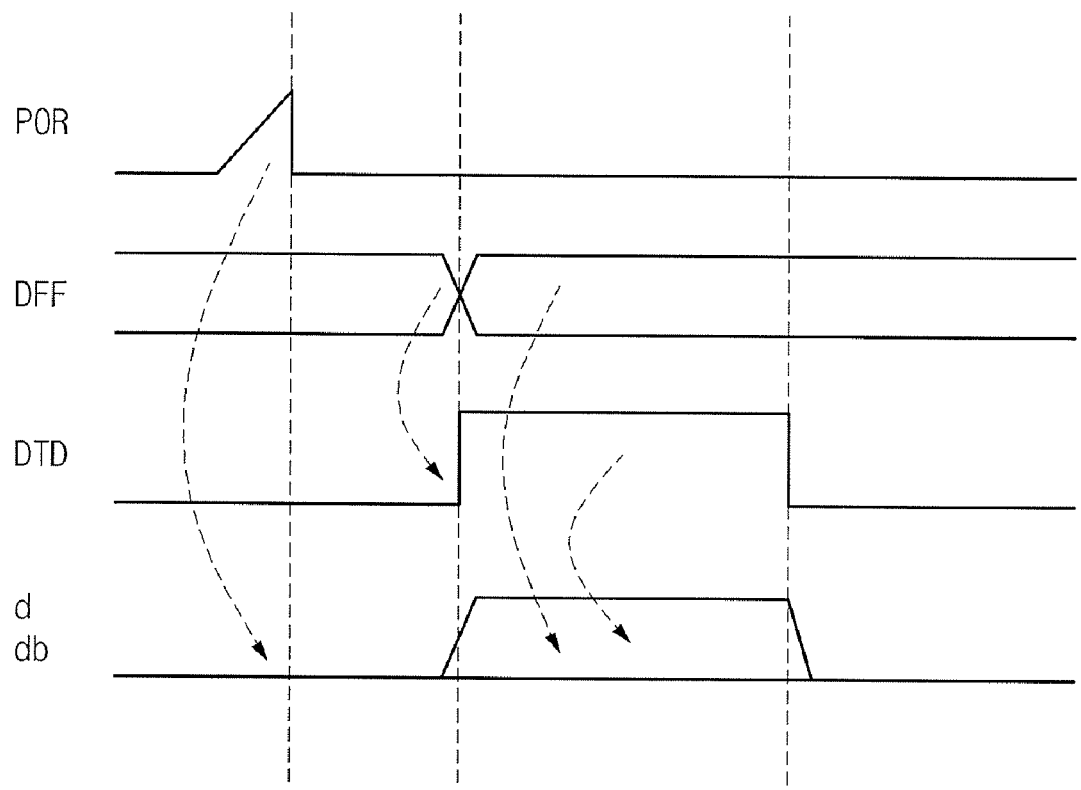
FIG. 8 shows the operational waveforms of the input control unit of FIG. 7.

The operation process of the input control unit 100 having such configuration will be illustrated with reference to the operation timing diagram of FIG. 8.

First, the NMOS transistor N1 is turned on until the power on reset signal POR reaches a given voltage level, so that the data signals d, db are outputted at a low voltage level. In the state where the power on reset signal POR is maintained at a low voltage level, the NMOS transistor N1 is maintained at a turned off state. Moreover, both of the data signals d, db are maintained at a low voltage level until the level of the delay signal DFF is changed.

The data transition detection signal DTD is transitioned to a high voltage level when the level of the delay signal DFF is transitioned. Accordingly, one data signal among the data signals d, db is transitioned to a high voltage level for the period in which the data transition detection signal DTD is maintained at a high voltage level. Thereafter, the one data signal is then transitioned back to a low voltage level in the case when the data transition detection signal DTD is transitioned to a low voltage level.

Figure 9:
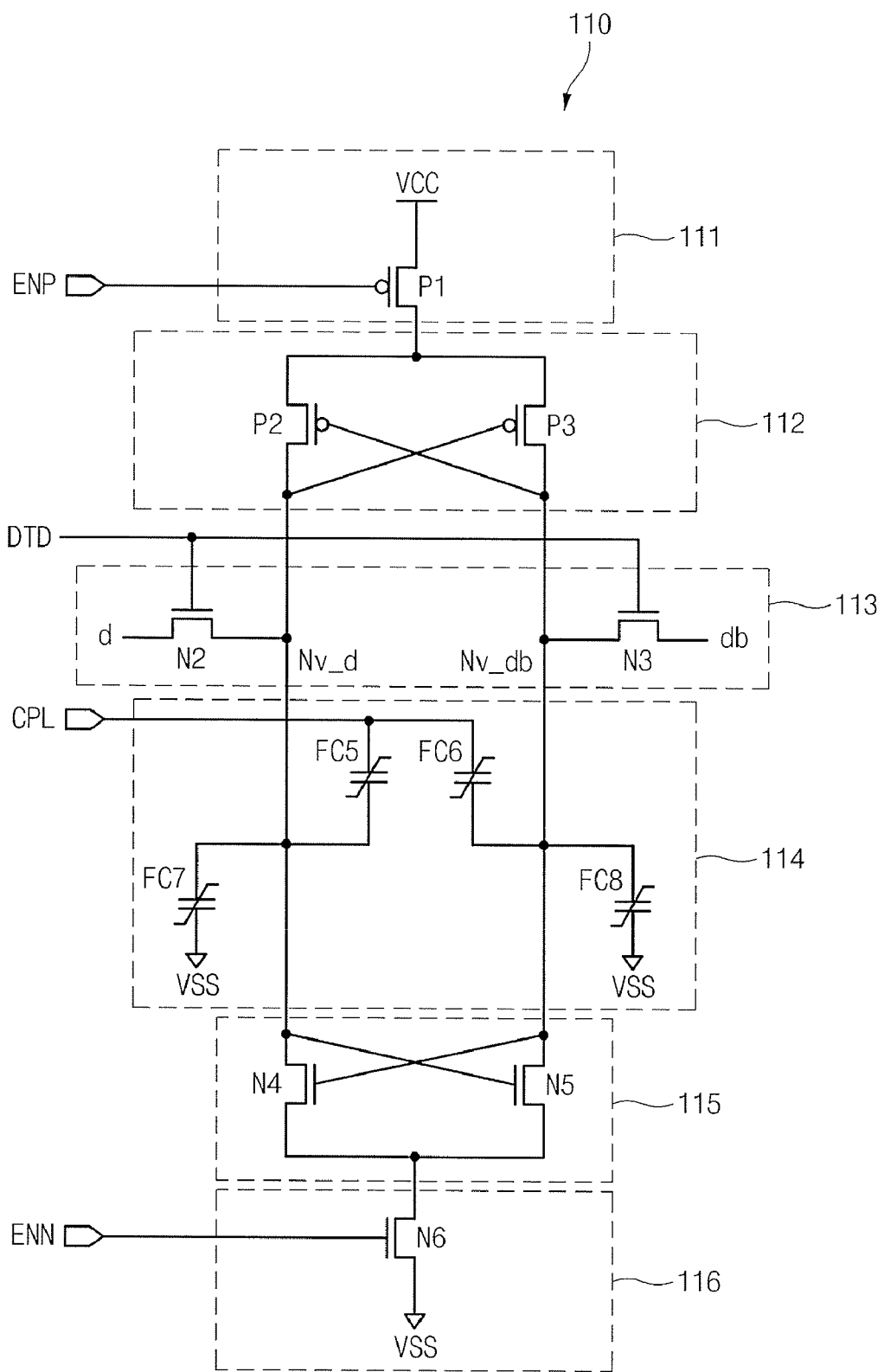
FIG. 9 is a circuit diagram of a storage unit of FIG. 6.

FIG. 9 is a detailed circuit diagram of a storage unit of FIG. 6.

The storage unit 110 includes a pull-up unit 111, a pull-up latch unit 112, an input/output unit 113, a non-volatile storage unit capacitor unit 114, a pull-down latch unit 115, and a pull down unit 116.

Here, the pull-up unit 111 includes a PMOS transistor P1 that is connected between a power supply voltage VCC applying terminal and the pull-up latch unit 112. The gate of the PMOS transistor P1 is connected to the pull up enable signal ENP.

The pull-up latch unit 112 includes the PMOS transistors P2, P3. The PMOS transistor P2 is connected between the PMOS transistor P1 and an output terminal of a non-volatile data Nv_d of a NMOS transistor N2 of the input/output unit 113. The gate of the PMOS transistor P2 is connected to output terminal of the non-volatile data Nv_db of a NMOS transistor N3 of the input/output unit 113. The PMOS transistor P3 is connected between the PMOS transistor P1 and an output terminal of a non-volatile data Nv_db of a NMOS transistor N3 of the input/output unit 113. The gate of the PMOS transistor P3 is connected to the connected to output terminal of the non-volatile data Nv_d of a NMOS transistor N2 of the input/output unit 113. Thereby, the gate terminals of the PMOS transistors P2, P3 are cross coupled connected together.

The input/output unit 113 includes the NMOS transistors N2, N3. Here, the NMOS transistor N2 is connected between the output terminal of the non-volatile data Nv_d and the data d output terminal, and its gate is connected to the data transition detection signal DTD. The NMOS transistor N3 is connected between the output terminal of the non-volatile data Nv_db and the data db output terminal, and its gate is also connected to the data transition detection signal DTD.

The non-volatile storage unit capacitor unit 114 includes a plurality of non-volatile ferroelectric capacitors FC5~FC8. Here, the non-volatile ferroelectric capacitors FC5, FC6 are connected between the cell plate signal CPL applying terminal and the output terminal of the non-volatile data Nv_d, Nv_db respectively. The non-volatile ferroelectric capacitors FC7, FC8 are connected between the respective output terminal of the non-volatile data Nv_d, Nv_db and a ground voltage terminal.

The pull-down latch unit 115 includes the NMOS transistors N4, N5. Here, the NMOS transistor N4 is connected between the Nv_d node of the non-volatile storage unit capacitor unit 114 and the NMOS transistor N6, while its gate is connected to the Nv_db node of the non-volatile storage unit capacitor unit 114. The NMOS transistor N5 is connected between the Nv_db node of the non-volatile storage unit capacitor unit 114 and the NMOS transistor N6, while its gate is connected to the Nv_d node of the non-volatile storage unit capacitor unit 114. Whereby the gates of the NMOS transistors N4, N5 are cross coupled together. The pull-down unit 116 includes the NMOS transistor N6 which is connected between the pull-down latch unit 115 and the ground voltage terminal, and its gate is connected to the pull down enable signal ENN.

Figure 10:
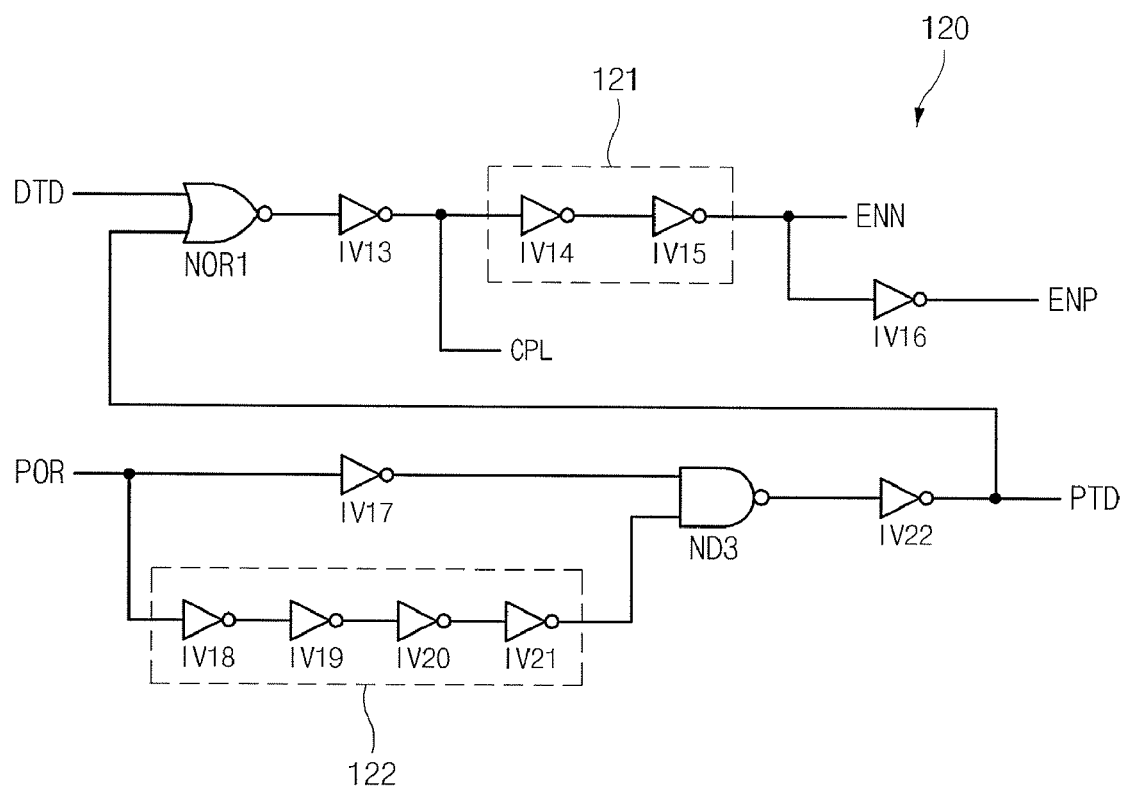
FIG. 10 is a circuit diagram of a storage control unit of FIG. 6.

FIG. 10 is a detailed circuit diagram of a storage control unit of FIG. 6.

The storage control unit 120 includes a NOR gate NOR1, and a NAND gate ND3, and a plurality of inverters IV13~IV22. Here, the delay unit 121 includes the inverters IV14, IV15, and the delay unit 122 includes a plurality of inverters IV18~IV21.

The NOR gate NOR1 performs a NOR operation on the data transition detection signal DTD and the power transition detection signal PTD. The inverter IV13 inverts the output of the NOR gate NOR1 to output the cell plate signal CPL.

The delay unit 121 delays the cell plate signal CPL for a predetermined time and outputs the pull down enable signal ENN. The inverter IV16 inverts the pull down enable signal ENN and outputs the pull up enable signal ENP.

The delay unit 122 delays output of the power-on reset signal POR for a predetermined time. In addition, the NAND gate ND3 performs a NAND operation on the power-on reset signal POR inverted by the inverter IV17, and the output of the delay unit 122. The inverter IV22 inverts the output of the NAND gate ND3 and outputs the power transition detection signal PTD.

When the power is turned on, the power transition detection signal PTD is generated in response to the power on reset signal POR. The pull down enable signal ENN, the pull up enable signal ENP, and the cell plate signal CPL are generated in the case when the power transition detection signal PTD is generated.

That is, when the power is turned on, the data repair operation is performed. Here, the power transition detection signal PTD is used a signal for detecting whether the power on reset signal POR transitions or not. When in the normal power supply voltage period, the data transition detection signal DTD is generated by the clock CLK to write a new data.

The operation of the storage control unit 120 having such configuration will be illustrated with reference to the operation timing diagram of FIGS. 11 and 12.

Figure 11:
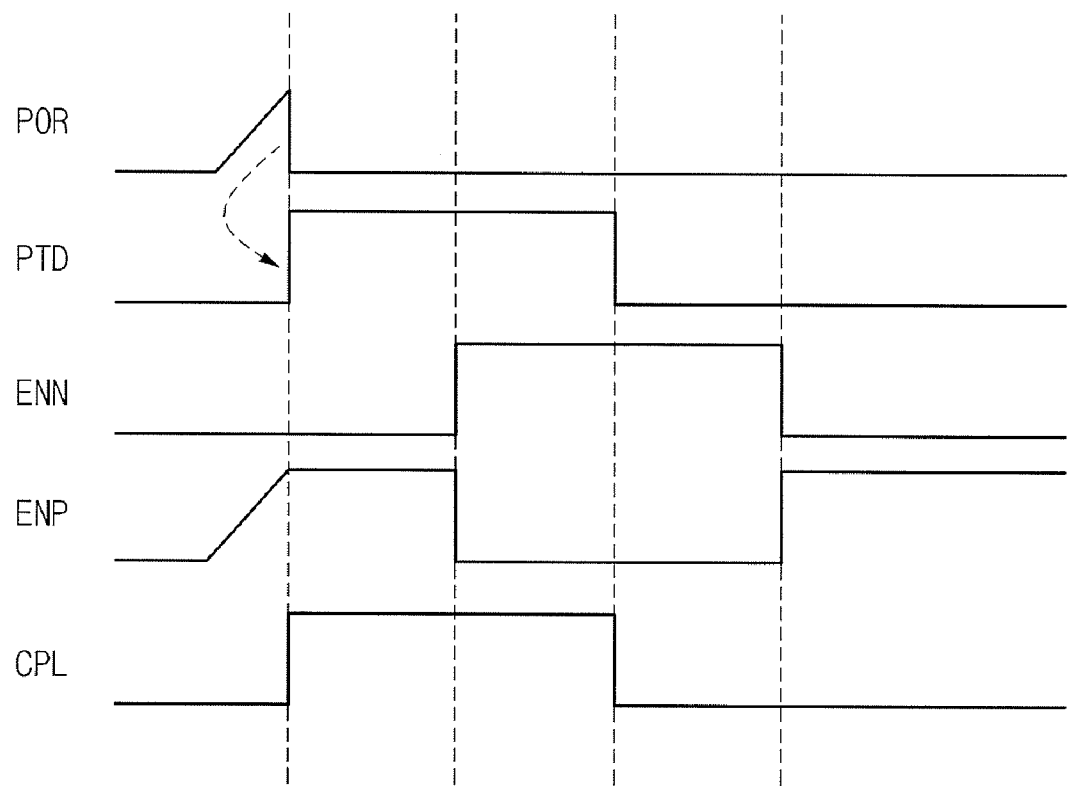
FIGS. 11-12 show the operational waveforms of the storage control unit of FIG. 10.

As shown in FIG. 11, when the voltage level of the power-on reset signal POR transitions to a low voltage level after gradually increasing, the power transition detection signal PTD is delayed due to the delay time of the delay unit 122 and is maintained at a high level.

At this time, the cell plate signal CPL is transitioned to a high level when the power on reset signal POR is transitioned to a high level. While the cell plate signal CPL is transitioned to a low level when the power on reset signal POR is transmitted to the low level.

Additionally, in the case when the voltage level of the power-on reset signal POR increases, the pull up enable signal ENP gradually increases, so that the pull up enable signal ENP is maintained at a high level when the power-on reset signal POR is transitioned to the low level.

Further, in the case where a predetermined time passes by after the power transition detection signal PTD is transitioned to a high voltage level, the pull down enable signal ENN is transitioned to a high level. Further, the pull up enable signal ENP is transitioned to the low level in the case when the pull down enable signal ENN is transitioned to a high level.

Figure 12:
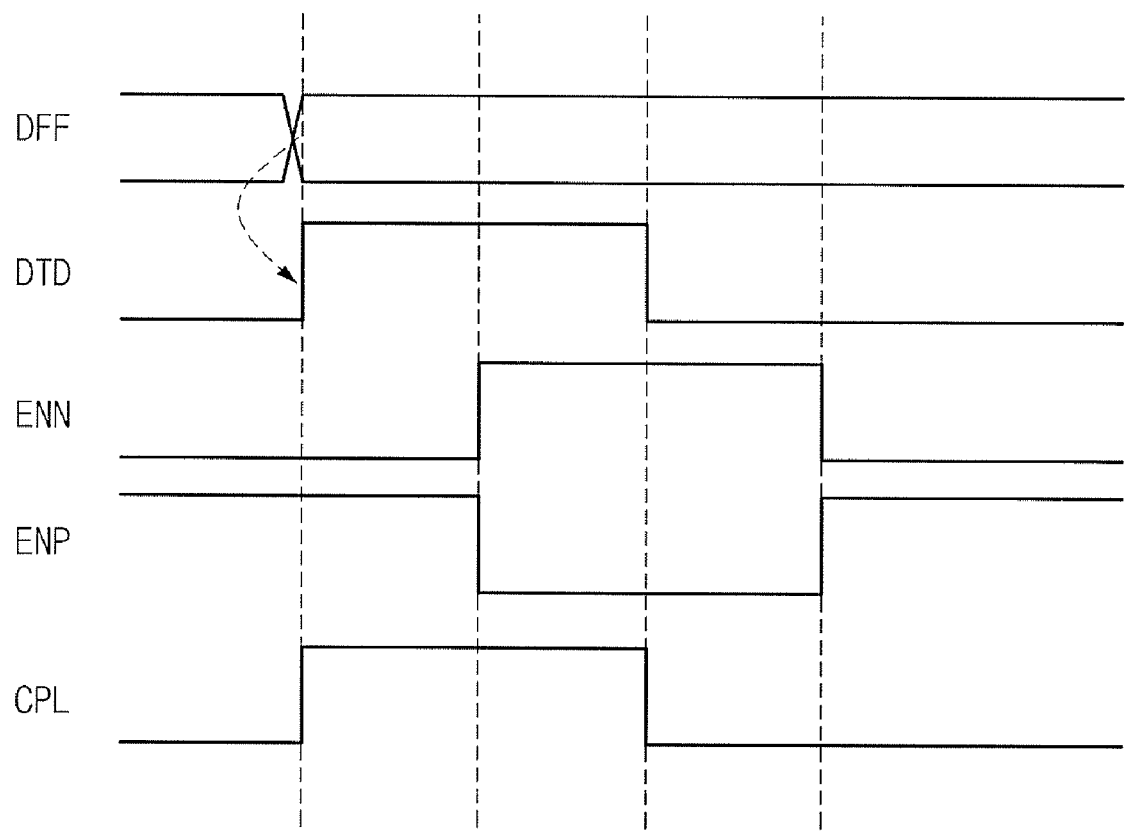

As shown in FIG. 12, in the case when the data level of the delay signal DFF transitions, the data transition detection signal DTD is transitioned to the high voltage level. At this time, the cell plate signal CPL is transitioned to a high level. In the case when the data transition detection signal DTD is transitioned again to a low level, the cell plate signal CPL is transitioned to a low level.

At this time, in the case when a predetermined time transpires after the data transition detection signal DTD is transitioned to a high voltage level, the pull down enable signal ENN is transitioned to the high level. In the case when the pull down enable signal ENN is transitioned to a high level, the pull up enable signal ENP is transitioned to a low level.

Figure 13:
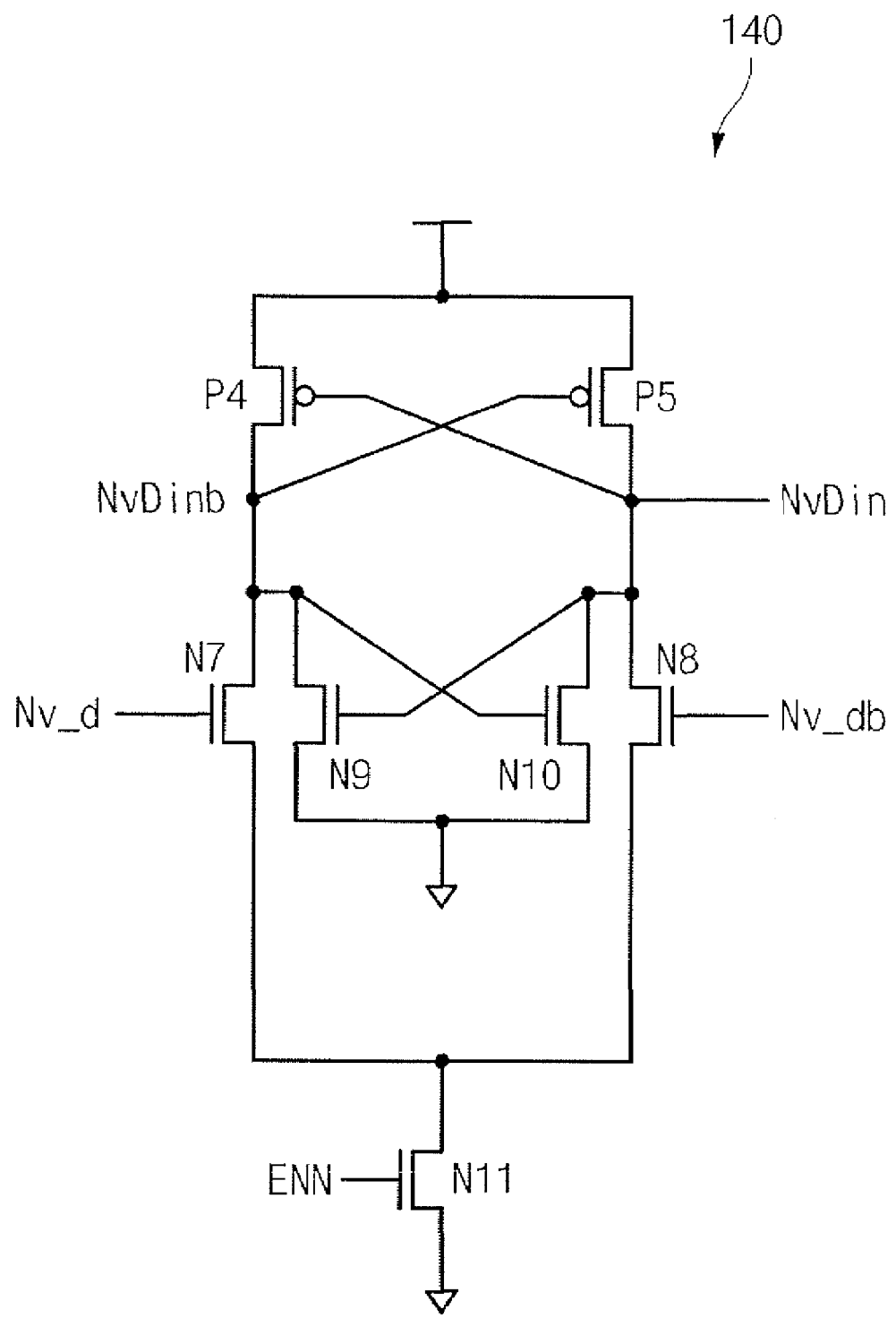
FIG. 13 is a circuit diagram of the latch unit of FIG. 6.

FIG. 13 is a detailed circuit diagram of the latch unit of FIG. 6.

The latch unit 140 includes PMOS transistors P4, P5, and NMOS transistors N7~N10. Here, the PMOS transistors P4, P5 are connected between the power supply voltage terminal and the output terminal of the input data NvDinb, NvDin, while the gates are cross coupled together.

The NMOS transistor N7, N8 is connected between the PMOS transistor P4, P5 and the NMOS transistor N11, and the non-volatile data Nv_d, Nv_db signals are applied to the respective gates. The NMOS transistors N9, N10 are connected between the respective PMOS transistors P4, P5 and the ground voltage terminal, while the gates of the NMOS transistors are cross coupled together. In addition, the NMOS transistor N11 is connected between a commonly shared node of the NMOS transistor N7, N8 and the ground voltage terminal, while its gate is connected to the pull down enable signal ENN.

The latch unit 140 is activated for the period when the pull down enable signal ENN is at a high level. That is, in the case when the non-volatile data Nv_d, Nv_db is inputted to the gate terminal of the NMOS transistor N7, N8, the input data of the output node NvDinb, NvDin value are newly set up. The latch unit 140 latches the input data NvDinb, NvDin for the period when the pull down enable signal ENN is at a low level.

Figure 14:
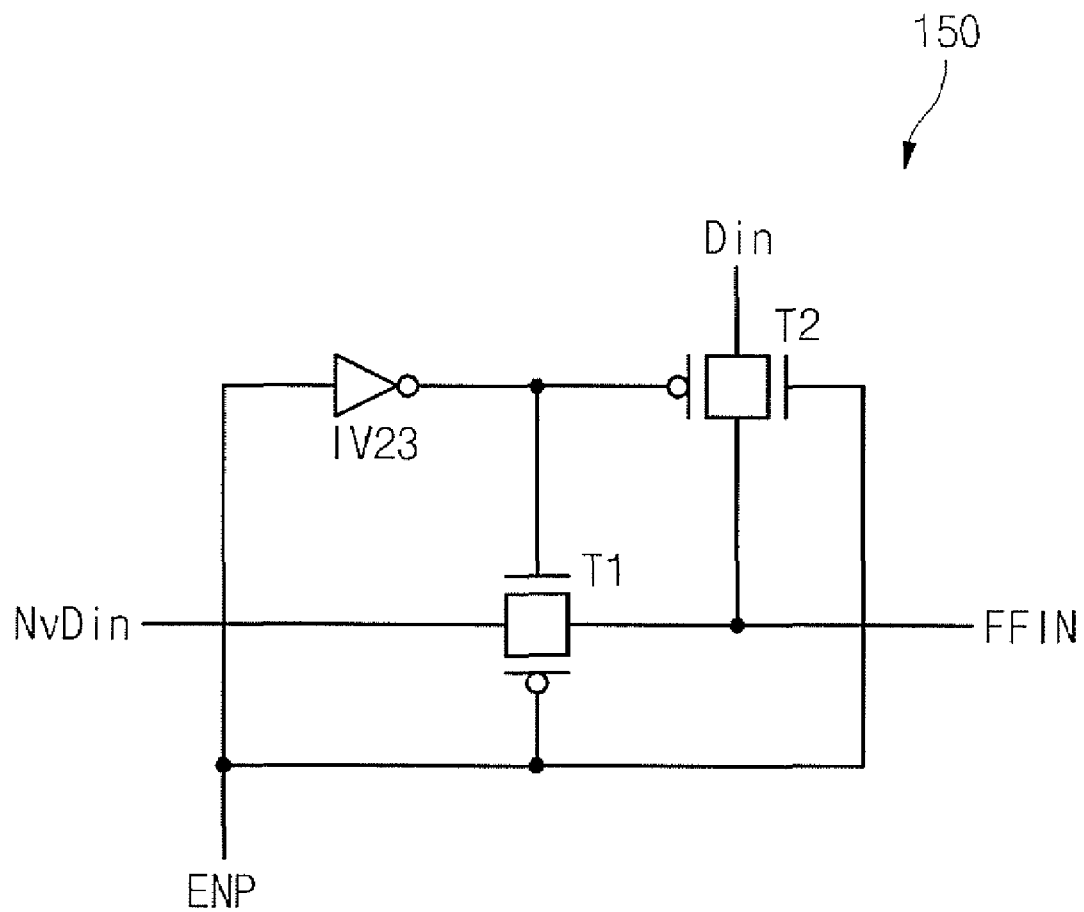
FIG. 14 is a circuit diagram of a data select unit of FIG. 6.

FIG. 14 is a detailed circuit diagram of a data select unit 150 of FIG. 5.

The data select unit 150 includes transmission gates T1, T2, and an inverter IV23 as a transmission unit. Here, in the case when the pull up enable signal ENP is at a low level, the transmission gate T1 is turned on and outputs the input data NvDin as an input signal FFIN. At this time, the transmission gate T2 maintains the turn-off state.

On the other hand, in the case when the pull up enable signal ENP is at a high level, the transmission gate T2 is turned on and outputs the external input data Din as an input signal FFIN. At this time, the transmission gate T1 is maintained in a turn-off state.

Figure 15:
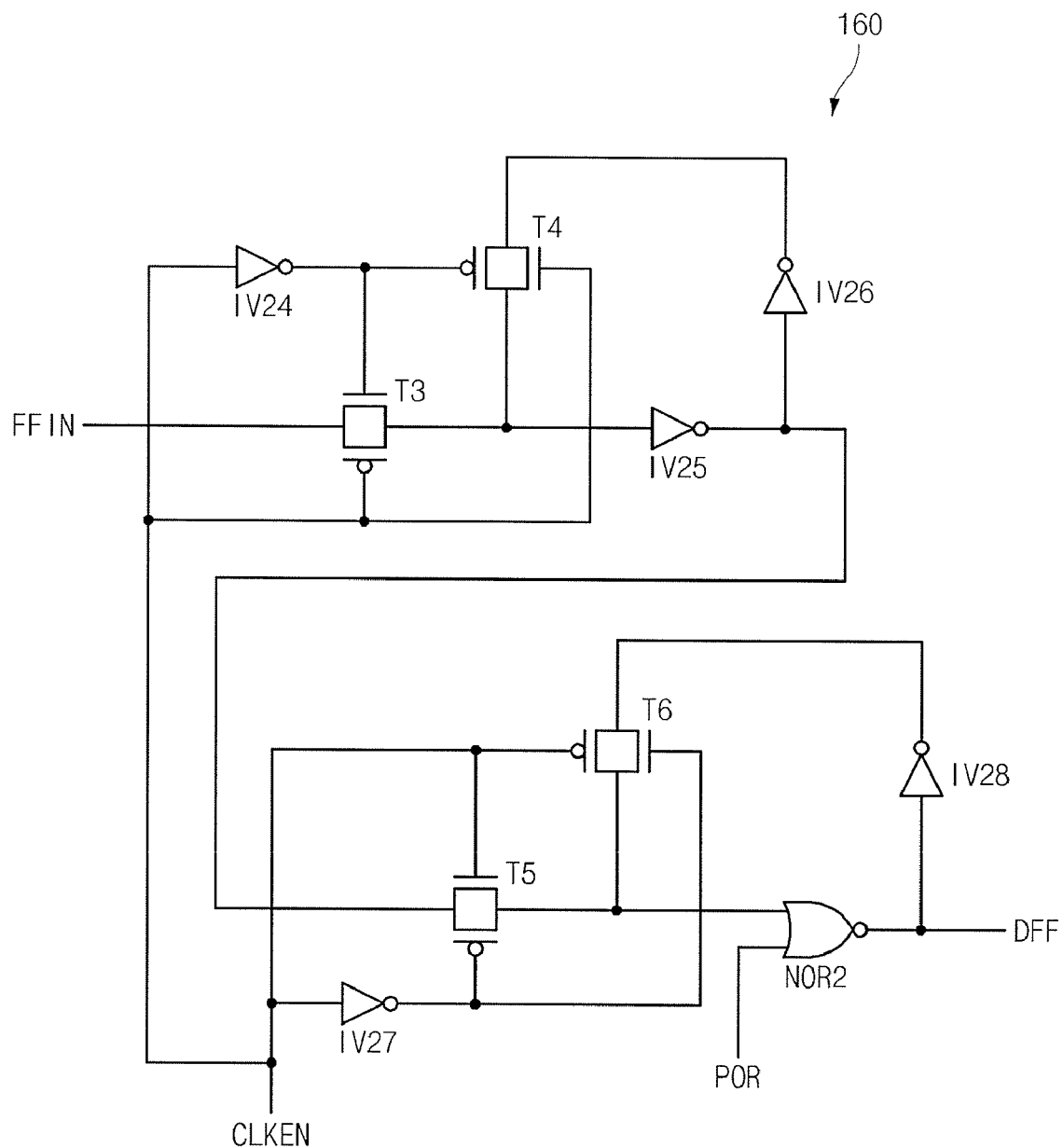
FIG. 15 is a circuit diagram of a flip-flop of FIG. 6.

FIG. 15 is a detailed circuit diagram of a flip-flop of FIG. 6.

The flip-flop 160 includes a plurality of transmission gates T3~T6, a plurality of inverters IV24~IV28 and a NOR gate NOR2.

Here, the transmission gate T3 selectively outputs the input signal FFIN in response to the clock enable signal CLKEN. That is, the transmission gate T3 outputs the input signal FFIN in the case when the clock enable signal CLKEN is at a low level.

On the other hand, the transmission gate T4 and the inverters IV25, IV26 latch the output of the transmission gate T3 in response to the clock enable signal CLKEN. That is, the transmission gate T4 outputs the latched signal in the case when the clock enable signal CLKEN is at a high level.

The transmission gate T5 selectively outputs the output of the inverter IV25 in response to the clock enable signal CLKEN. That is, the transmission gate T5 outputs the output signal of the inverter IV25 in the case when the clock enable signal CLKEN is at a high level.

On the other hand, the transmission gate T6, the NOR gate NOR2 and the inverter IV28 latch the output of the transmission gate T5 in response to the power-on reset signal POR.

That is, the transmission gate T6 outputs the delay signal DFF in the case when the clock enable signal CLKEN is at a low level.

When the power reaches a normal level, the power on reset signal POR is maintained at a low level. Therefore, in the state where a normal power is applied, in the case when the clock enable signal CLKEN is transitioned from the low level to the high level, the input signal FFIN is delivered to the delay signal DFF. In the case when the clock enable signal CLKEN is transitioned from the high level to the low level, the input signal FFIN is latched.

Figure 16:
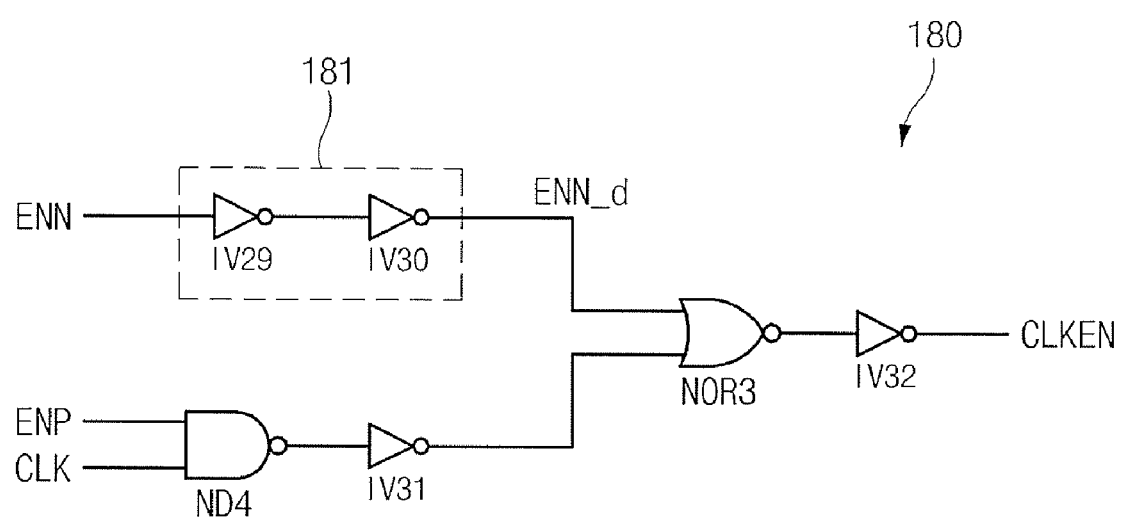
FIG. 16 is a circuit diagram of a clock control unit of FIG. 6.

FIG. 16 is a detailed circuit diagram of a clock control unit 180 of FIG. 6.

The clock control unit 180 includes a delay unit 181, a NAND gate ND4, a NOR gate NOR3, and an inverter IV31, IV32. Here, the delay unit 181 delays the pull down enable signal ENN from the delay time brought about by the inverters IV29, IV30 and the delay unit 181 outputs the delay signal ENN_d.

The NAND gate ND4 performs a NAND operation on the pull up enable signal ENP, and on the clock CLK. The NOR gate NOR3 performs a NOR operation on the delay signal ENN_d, and on the output of the inverter IV31. The inverter IV32 inverts the output of the NOR gate NOR3 and outputs the clock enable signal CLKEN.

The clock control unit 180 performs a logical multiply operation on the pull up enable signal ENP and the clock CLK so that the external clock CLK is not inputted for the time period when the pull up enable signal ENP is operating in the low level by the power on reset signal POR.

Additionally, in the case when the data repair operation is performed by the power on reset signal POR, the clock enable signal CLKEN is activated at a high level using the delay signal ENN_d. Accordingly, the restored data is latched by the delay signal DFF.

Figure 17:
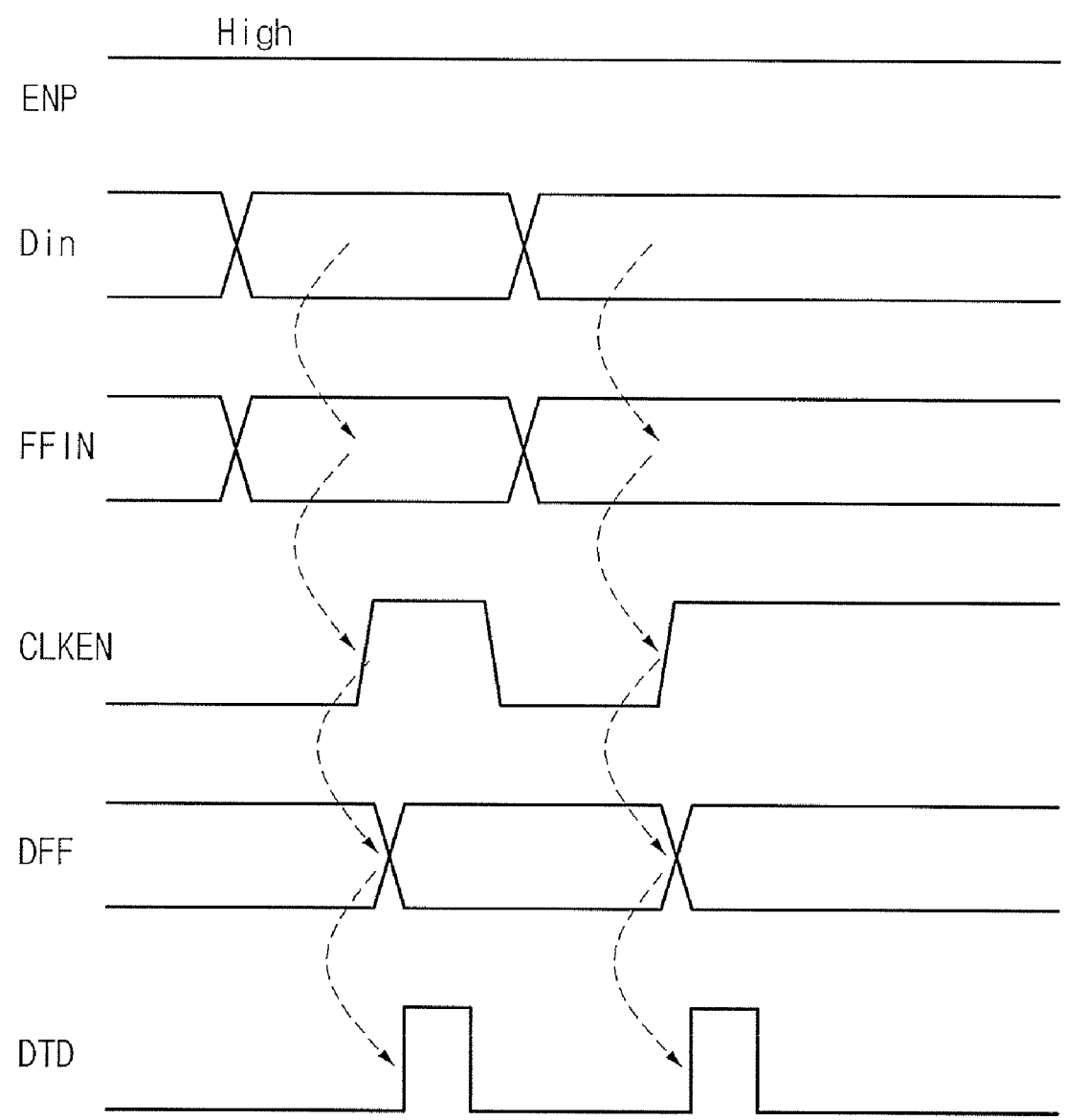
FIG. 17 shows the operational waveforms of a data transition detecting unit of FIG. 6.

FIG. 17 is an operation waveform of a data transition detecting unit 200 of FIG. 6.

In the case when the pull up enable signal ENP is activated with a high level, the data select unit 150 outputs the input data Din as an input signal FFIN. The flip-flop 160 also outputs the delay signal DFF when the clock enable signal CLKEN is transitioned at a high level.

The data transition detecting unit 200 detects the transition point of such delay signal DFF, and outputs the data transition detection signal DTD having a pulse shape in the case when the level of the delay signal DFF is changed.

Figure 18:
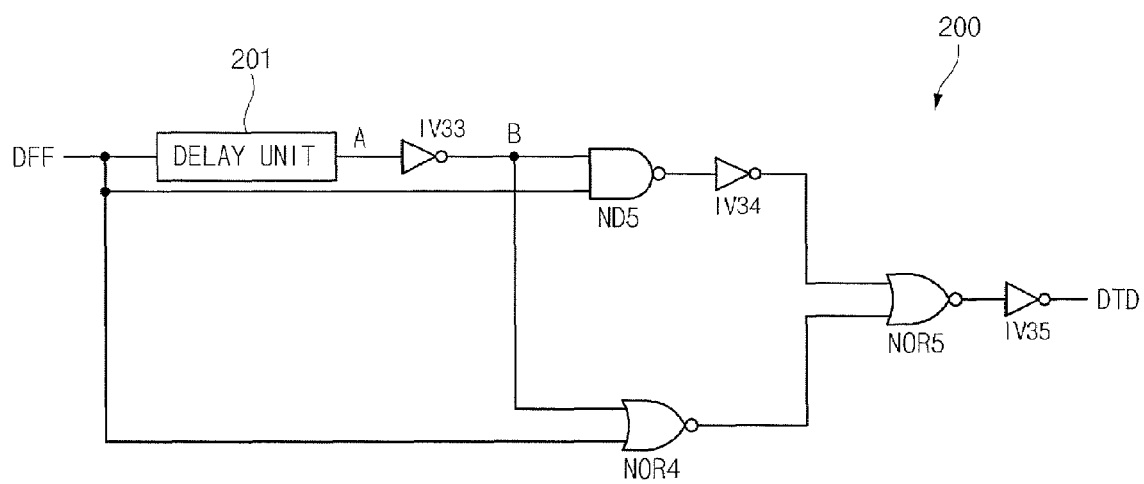
FIG. 18 is a circuit diagram of a data transition detecting unit of FIG. 6.

FIG. 18 is a detailed circuit diagram of a data transition detecting unit 200 of FIG. 6.

The data transition detecting unit includes a delay unit 201, a plurality of inverters IV33~IV35, a NAND gate ND5, and a plurality of NOR gates NOR4, NOR5.

The delay unit 201 delays the delay signal DFF for a predetermined time when b outputting the delay signal DFF to a node A. The NAND gate ND5 performs a NAND operation on a node-B and on the delay signal DFF. The NOR gate NOR4 performs a NOR operation on the output of the node-B and on the delay signal DFF.

The NOR gate NOR5 performs a NOR operation on the output of the inverter IV34 and the output of the NOR gate NOR4. The inverter IV35 inverts the output of the NOR gate NOR5 to output the data transition detection signal DTD.

Figure 19:
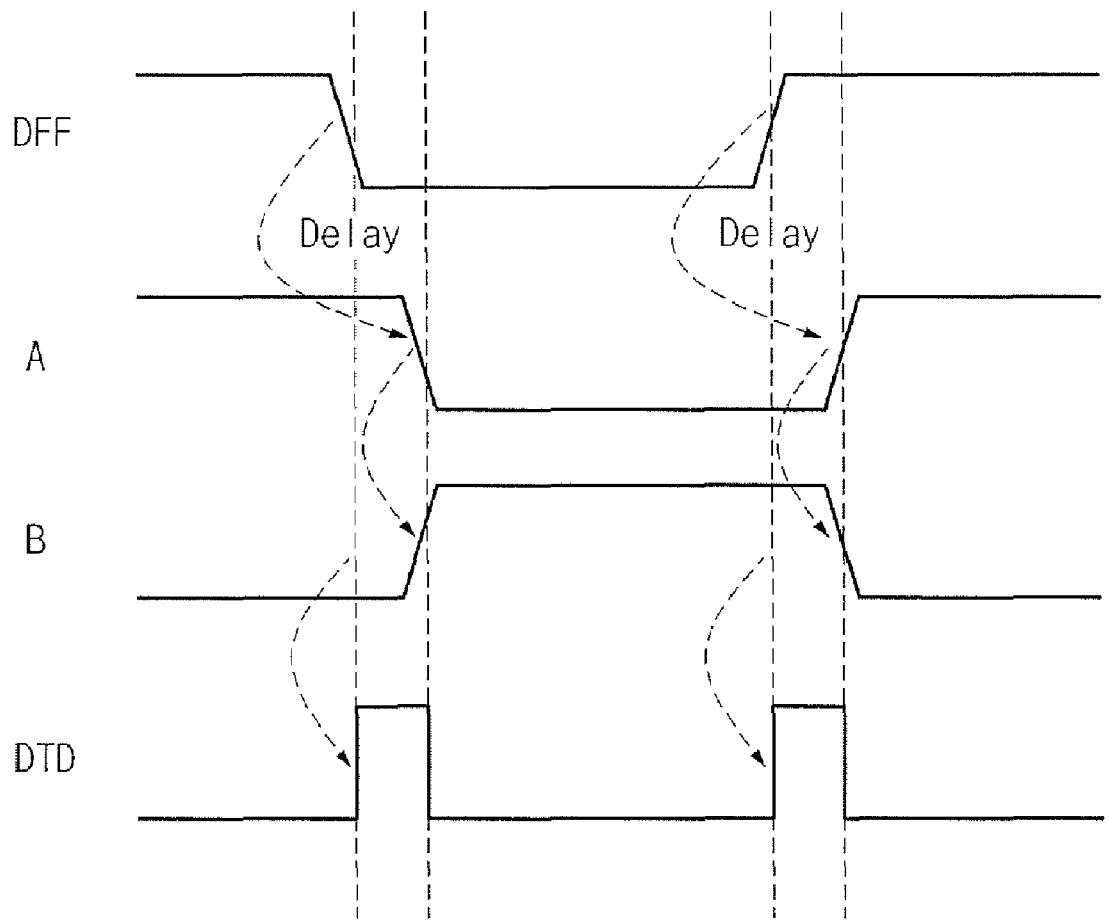
FIG. 19 shows the operational waveform a of the data transition detecting unit of FIG. 18.

The operation of the data transition detecting unit 200 will be illustrated with reference to the operation timing diagram of FIG. 19.

The delay unit 201 delays the delay signal DFF for a predetermined amount of time to output the delay signal DFF at the node A. The signal of the node A is then inverted by the inverter IV33 and is outputted to the node-B. Accordingly, an OR operation is performed on the output of the inverter IV34 and the output of the NOR gate NOR4 to output the data transition detection signal DTD.

That is, the data transition detection signal DTD having a pulse width that begins when the delay signal DFF becomes a low level and ends before the time when the signal of the node-B transitions to a high level is outputted.

Figure 20:
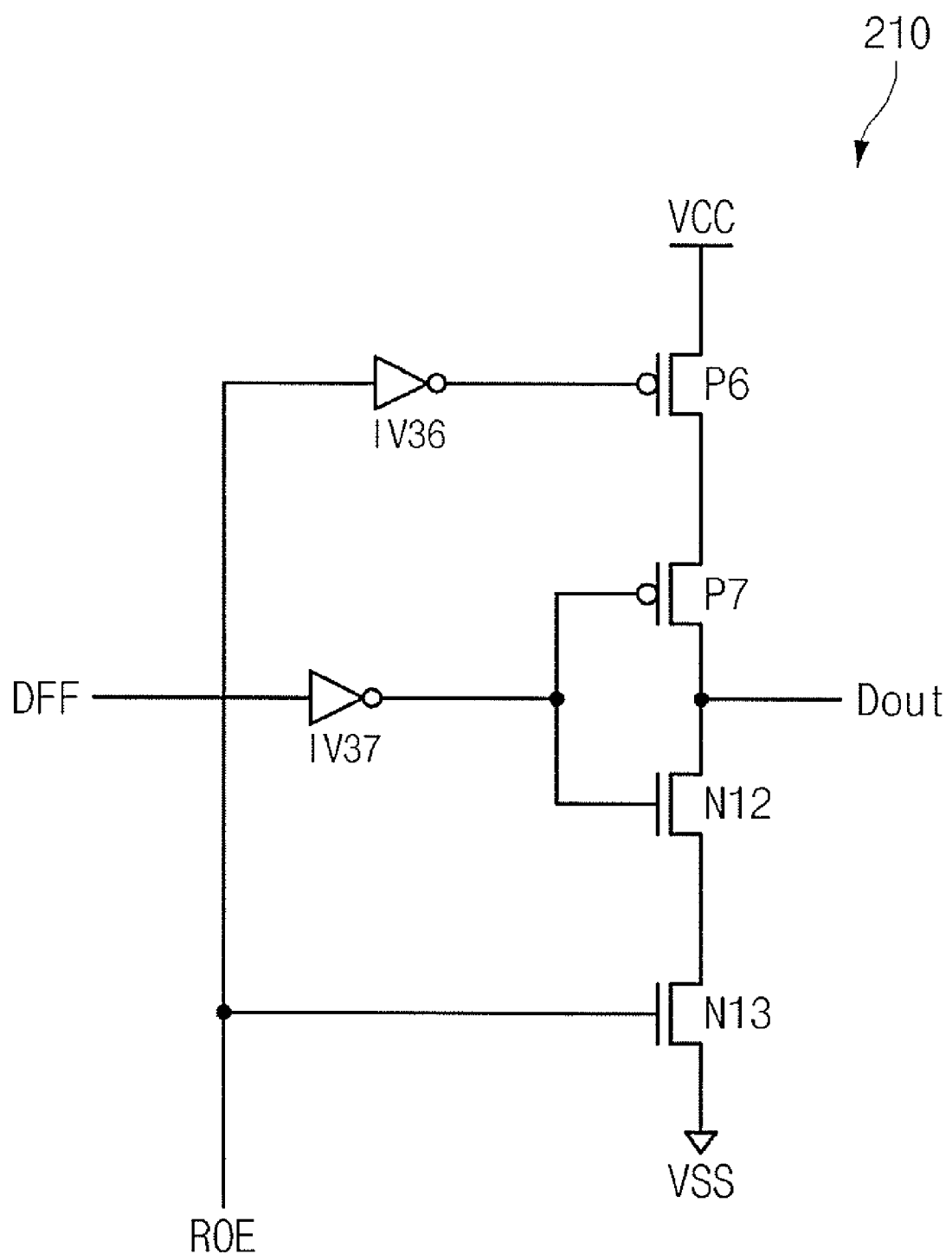
FIG. 20 is a circuit diagram of a data output unit of FIG. 6.

FIG. 20 is a detailed circuit diagram of a data output unit 210 of FIG. 6.

The data output unit 210 includes an inverter IV36, IV37, a plurality of PMOS transistors P6, P7, and a plurality of NMOS transistors N12, N13.

The PMOS transistor P6 is connected between the power supply voltage applying terminal VCC and the PMOS transistor P7, while its gate is connected to the latch output enable signal ROE inverted by the inverter IV36. The PMOS transistor P7 is connected between the PMOS transistor P6 and the output terminal of the output data Dout, while its gate is connected to the delay signal DFF inverted by the inverter IV37.

In addition, the NMOS transistor N12 is connected between the output terminal of the output data Dout and the NMOS transistor N13, while its gate is connected to the delay signal DFF inverted by the inverter IV37. The NMOS transistor N13 is connected between the NMOS transistor N12 and the ground voltage terminal, while its gate is connected to the latch output enable signal ROE.

As to data output unit 210 having such configuration, in the case when the latch output enable signal ROE is applied having a high level and the delay signal DFF is transitioned to a high level, the PMOS transistors P6, P7 are turned on and the output data Dout is outputted in a high level.

On the other hand, as to the data output unit 210, in the case when the latch output enable signal ROE is applied with a high level and the delay signal DFF is transitioned to a low level, the NMOS transistors N12,N13 are turned on and the output data Dout is outputted with a low level.

As to data output unit 210, when the latch output enable signal ROE is applied at a low level, the output data Dout is outputted with a high impedance (High-Z) state.

Figure 21:
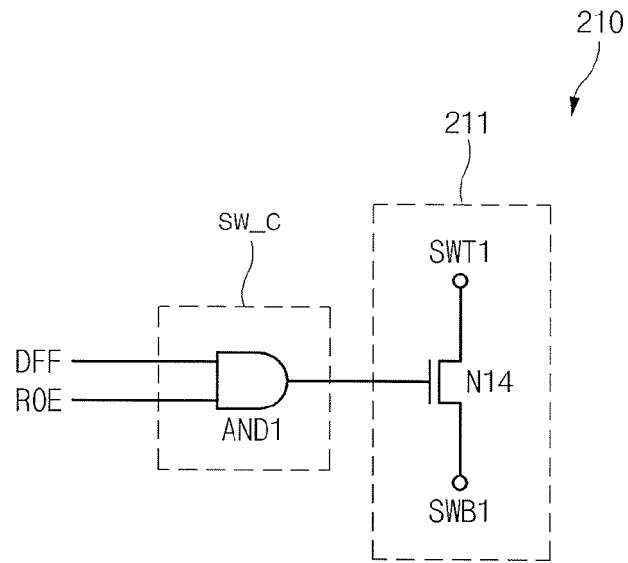
FIGS. 21 to 26 are circuit diagrams, each of which corresponding to the data output unit of FIG. 6 according to one of various embodiments of the present invention.

FIG. 21 is another embodiment of data output unit 210 of FIG. 6.

The data output unit 210 includes a switch control unit SW_C, and a switching unit 211. Here, the switch control unit SW_C includes an AND gate AND1 that performs an AND operation on the delay signal DFF and on the latch output enable signal ROE to output the output data Dout. The switching unit 211 includes a NMOS transistor N14 connected between the terminals SWT1, SWB1, while its gate is connected to the output data Dout.

The terminals SWT1, SWB1 correspond to the input-output terminal controlling the flow of a current. That is, the terminals SWT1, SWB1 are a switching element for controlling the input/output current which flows into the input node or the output node.

For instance, in the case when the output data Dout is applied with a high level, the NMOS transistor N14 is turned on, so that the terminals SWT1, SWB1 are in a short state. That is, the NMOS transistor N14 is turned on, and the gap of the terminals SWT1, SWB1 is connected. Accordingly, the current can be supplied to a corresponding node.

On the other hand, in the case when the output data Dout is applied at the low level, the NMOS transistor N14 is turned off, so that the terminals SWT1, SWB1 are in an open state. That is, when the NMOS transistor N14 is turned off and the connection between the terminals SWT1, SWB1 is blocked. Accordingly, the current is not supplied to a corresponding node.

Figure 22:
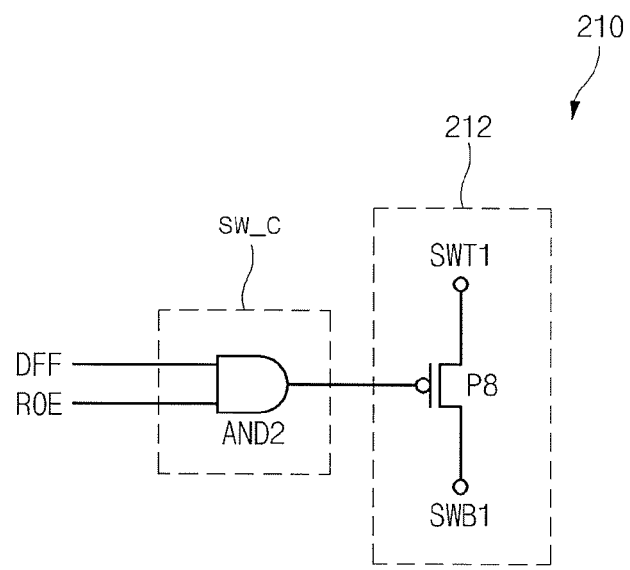

FIG. 22 is still another embodiment of data output unit 210 of FIG. 6.

The data output unit 210 includes a switch control unit SW_C, and a switching unit 212. Here, the switch control unit SW_C includes an AND gate AND2 that performs an AND operation on the delay signal DFF and on the latch output enable signal ROE. The switching unit 212 includes a PMOS transistor P8 that is connected between the terminal SWT1, SWB1, while its gate is connected to the output of the AND gate AND2.

Figure 23:
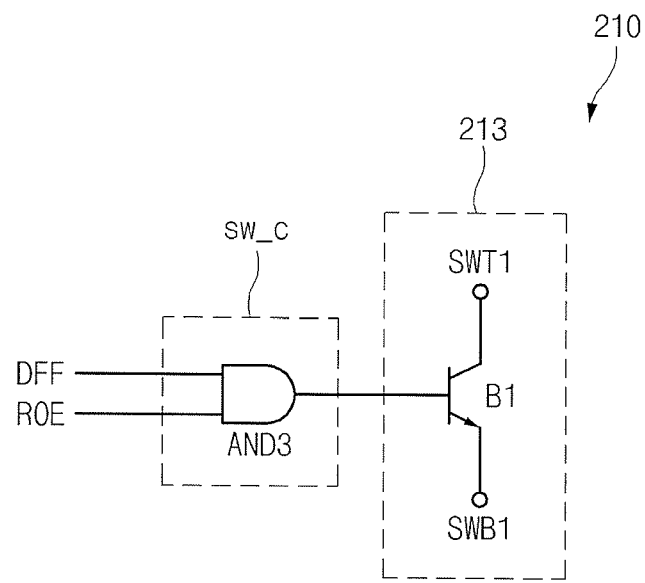

FIG. 23 is still another embodiment of data output unit 210 of FIG. 6.

The data output unit 210 includes a switch control unit SW_C, and a switching unit 213. Here, the switch control unit SW_C includes an AND gate AND3 that performs an AND operation on the delay signal DFF and on the latch output enable signal ROE. The switching unit 213 includes a bipolar junction transistor B1 that is connected between the terminals SWT1, SWB1, while the output of the AND gate AND3 is applied through a base terminal.

Figure 24:
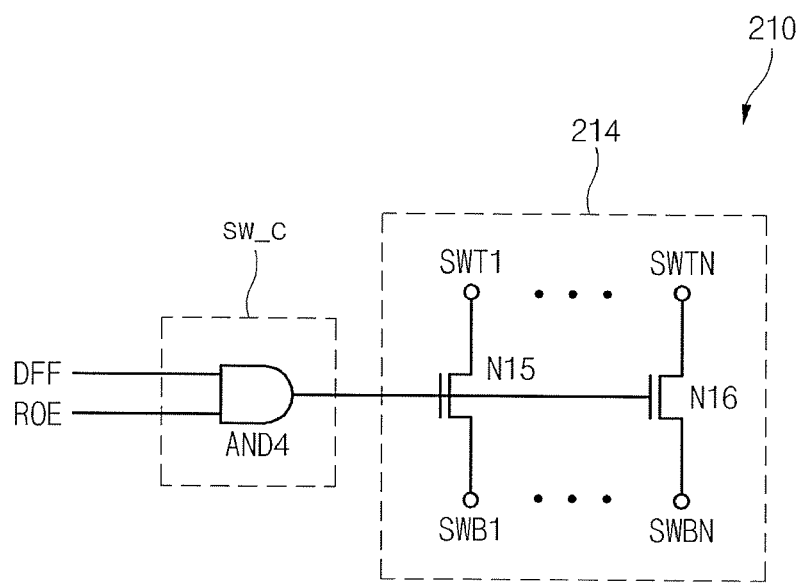

FIG. 24 is still another embodiment of data output unit 210 of FIG. 6.

The data output unit 210 includes a switch control unit SW_C, and a switching unit 212. Here, the switch control unit SW_C includes an AND gate AND4 which performs an AND operation on the delay signal DFF and the latch output enable signal ROE. The switching unit 214 includes a plurality of NMOS transistors N15, N16 that are in parallel with each other and connected between the terminal SWT, SWB, their respective gates are commonly connected to the output of the AND gate AND4.

The embodiment of FIG. 24 is used when the input/output node for interconnecting is a multiple, while a plurality of switching elements are turned on/turned off by only one output data Dout.

Figure 25:
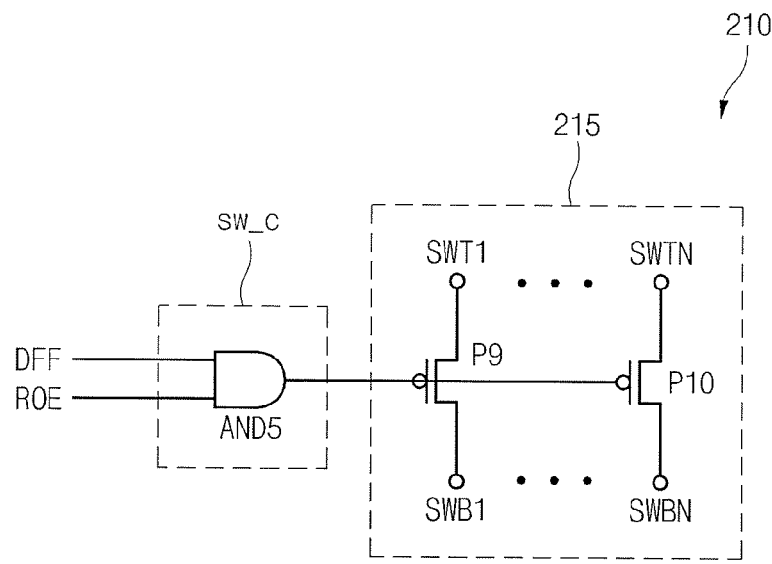

FIG. 25 is still another embodiment of data output unit 210 of FIG. 6.

The data output unit 210 includes a switch control unit SW_C, and a switching unit 215. The switch control unit SW_C includes an AND gate AND5 that performs an AND operation on the delay signal DFF and on the latch output enable signal ROE. The switching unit 215 includes a plurality of PMOS transistors P9, P10 that are in parallel with each other and are connected between the terminal SWT, SWB, while their respective gates are commonly connected the output of the AND gate AND5.

Figure 26:
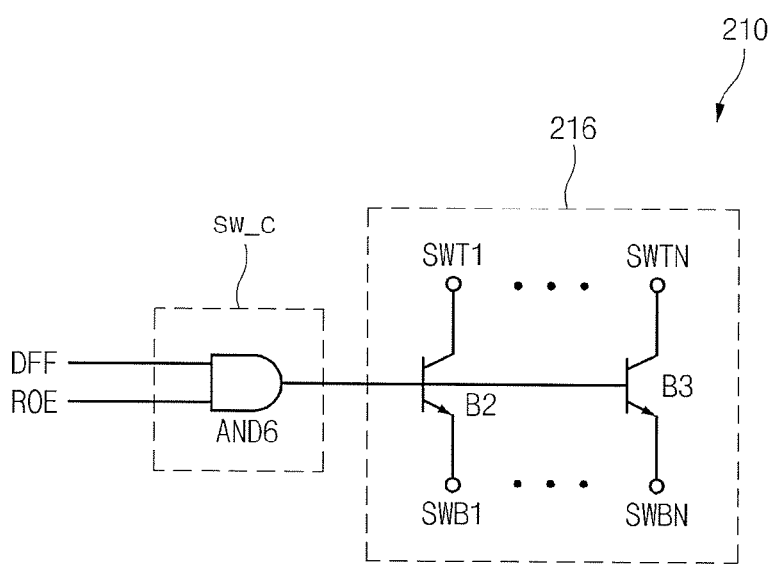

FIG. 26 is still another embodiment of data output unit 210 of FIG. 6.

The data output unit 210 includes a switch control unit SW_C, and a switching unit 216. Here, the switch control unit SW_C includes an AND gate AND6 that performs an AND operation on the delay signal DFF and on the latch output enable signal ROE. The switching unit 216 includes a plurality of bipolar junction transistors B2, B3 that are parallely connected between the terminal SWT, SWB, while their respective gates are commonly connected to the output of the AND gate AND6.

Figure 27:
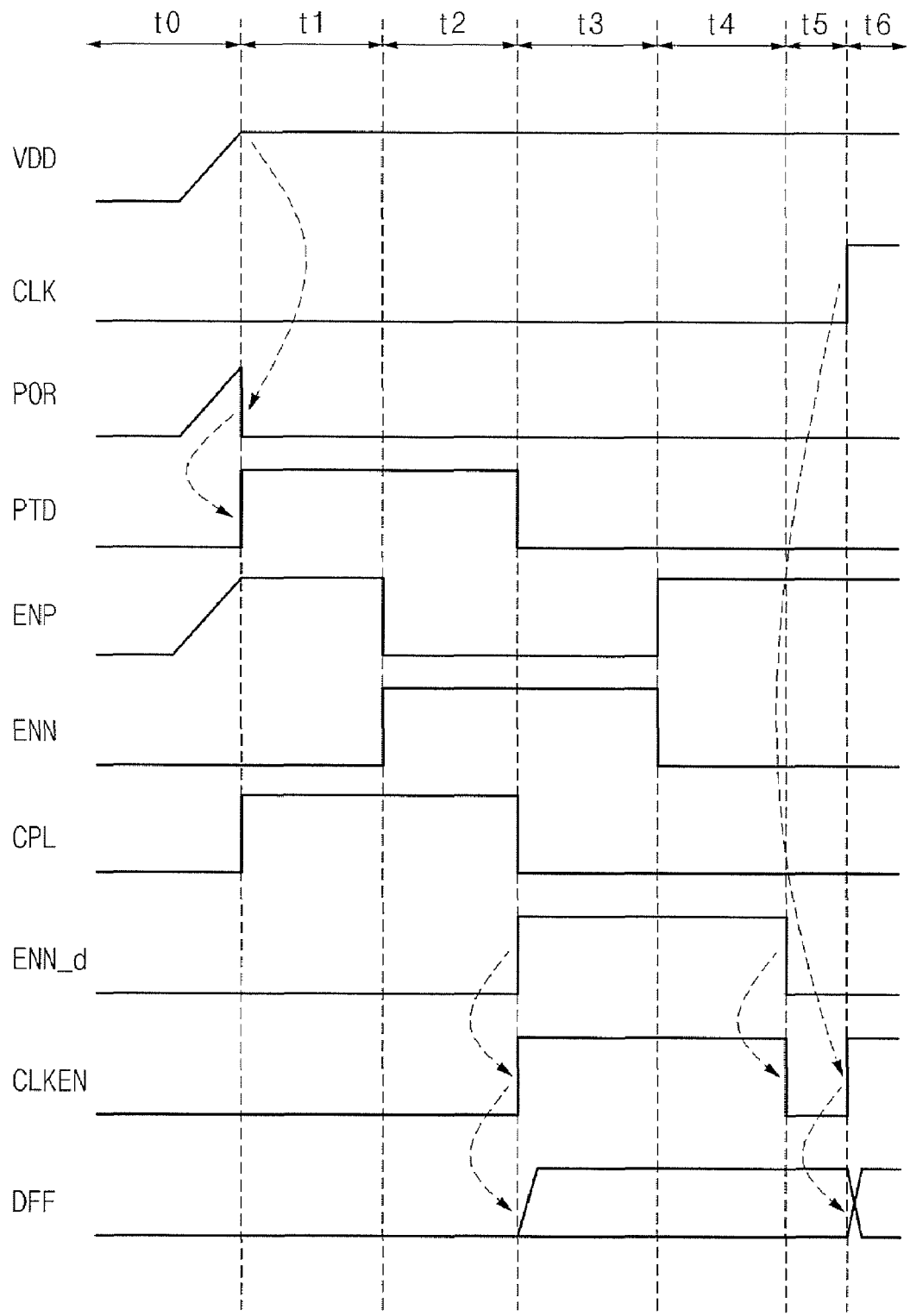
FIG. 27 is an operational timing diagram of the nonvolatile latch circuit according to an embodiment of the present invention.

FIG. 27 is an operation timing diagram of the nonvolatile latch circuit according to an embodiment of the present invention.

During the t0 period, the power supply voltage VDD level rises. Accordingly, the voltage level of the power on reset signal POR also rises.

During the t1 period, when the power supply voltage VDD rises to reach a stabilized voltage level, the power on reset signal POR is transitioned to a low level. When the power on reset signal POR is transmitted to a low level, the power transition detection signal PTD of the storage control unit 120 is transitioned to a high level, so that the high level is maintained for a delay time period brought about by the delay unit 122.

When the power on reset signal POR is activated, the cell plate signal CPL senses it, and is transitioned to a high level. At this time, the pull up enable signal ENP is raised to a high-level, while the pull down enable signal ENN is lowered to a low level. Therefore, the charge stored in the non-volatile ferroelectric capacitors FC5, FC6 of the non-volatile storage unit capacitor unit 114 generates a voltage difference in both sides of a node of the cell by the capacitance load of the non-volatile ferroelectric capacitors FC7, FC8.

Thereafter, in the t2 period, when a sufficient voltage difference is generated in both ends of the node, the pull up enable signal ENP is lowered to a low level, which turns on the PMOS transistor P1. Then, the pull down enable signal ENN is raised to a high level, which turns on the NMOS transistor N6. Accordingly, the non-volatile data Nv_d, Nv_db at both sides of the node of the cell is amplified by the pull-up latch unit 112, and the pull-down latch unit 115.

During the t3 period, in the case when the amplification of the non-volatile data Nv_d, Nv_db is completed, the power transition detection signal PTD and the cell plate signal CPL are transitioned back to a low level. Thereby, restoring the high data of the nonvolatile ferroelectric capacitor FC5 or the nonvolatile ferroelectric capacitor FC6 which was destroyed.

During the t3 period, the delay signal ENN_d is raised to a high level after the delay time of the delay unit 181. While being synchronized with the delay signal ENN_d, the clock enable signal CLKEN is activated to a high level. In addition, the delay signal DFF is transitioned to a high level when the clock enable signal CLKEN is activated to a high level.

During the t4 period, the pull up enable signal ENP is transitioned again to a high level, while the pull down enable signal ENN is transitioned to a low level.

Thereafter, in the t5 period, when the delay signal ENN_d is transitioned to a low level, and the clock enable signal CLKEN is transition to a low level.

During the t6 period, when the clock CLK is transitioned into a high level, the clock enable signal CLKEN is transitioned back up to a high level. Also the delay signal DFF is transitioned in the case when the clock enable signal CLKEN is activated to a high level.

The nonvolatile latch circuit according to an embodiment of the present invention can be applied to the FeRAM (Ferroelectric Random Access Memory), the RFID (Radio Frequency Identification), or the embedded SOC (Embedded System On Chip).

As illustrated in the above, the present invention can be used to store all kinds of the states which are generated in the operation of a system as a non-volatility, and to restore their respective previous states as in the case when re-booting a system. Moreover, the present invention improves system performance by replacing the hardware connection with the nonvolatile latch circuit having a fast working speed.

It will be clear that the present invention is well adapted to attain the ends and advantages mentioned as well as those inherent therein. While a various embodiments including the presently preferred one has been described for purposes of this disclosure, various changes and modifications may be made, which are well within the scope of the present invention. Numerous other changes may be made which will readily suggest themselves to those skilled in the art and which are encompassed in the spirit of the invention disclosed and as defined in the appended claims.

What is claimed is:

1. A nonvolatile latch circuit, comprising:
   an input control unit controlling data according to a power on reset signal, in response to a data transition detection signal, and in response to a delay signal, and storing and latching the data as a non-volatile state according to a control signal;
   a data control unit selecting one of an output and an input data of the input control unit according to the control signal, and outputting the delay signal synchronized with a clock enable signal;
   a storage control unit outputting the control signal according to the power on reset signal and in response to the data transition detection signal;
   a clock control unit outputting the clock enable signal in response to a clock, in response to a pull down enable signal, and in response to a pull up enable signal;
   a data transition detecting unit outputting the data transition detection signal by detecting whether the delay signal transitions; and
   a data output unit selectively outputting the output data according to the delay signal and in response to the latch output enable signal.

2. The nonvolatile latch circuit of claim 1,
   further comprising a power-on-reset unit outputting the power on reset signal by sensing a power supply voltage.

3. The nonvolatile latch circuit of claim 1,
   wherein the input control unit includes:
   an input control unit controlling the data according to the power on reset signal, in response to the data transition detection signal and in response to the delay signal;
   a storage unit storing the data as a non-volatile state in according to the data transition detection signal and in response to the control signal, and outputting a non-volatile data; and
   a latch unit latching the non-volatile data.

4. The nonvolatile latch circuit of claim 3,
   wherein the input control unit outputs the data with a low voltage level in case the power on reset signal is at a high level, when a level of the data is changed during a period when the data transition detection signal transitions.

5. The nonvolatile latch circuit of claim 3,
   wherein the storage unit stores the data in a non-volatile ferroelectric capacitor when the data transition detection signal is activated.

6. The nonvolatile latch circuit of claim 3, wherein the latch unit includes:
   a pull-down unit which accept the control signal;
   a pair of MOS transistors setting up a level of a data outputted according to the non-volatile data; and
   a latch unit latching the non-volatile data.

7. The nonvolatile latch circuit of claim 1,
   wherein the data control unit includes:
   a data select unit selecting one of the output and the input data of the input control unit according to the control signal; and
   a flip-flop outputting the delay signal by flip-flopping an output of the data select unit according to the clock enable signal.

8. The nonvolatile latch circuit of claim 7,
   wherein the data select unit selects and outputs the output data of the input control unit when the control signal is at a low level, and selects and outputs the input data when the control signal is at a high level.

9. The nonvolatile latch circuit of claim 7,
   wherein the flip-flop outputs the output of the data select unit as the delay signal when the clock enable signal transitions to a high level, and latches the output of the data select unit when the clock enable signal transitions to a low level.

10. The nonvolatile latch circuit of claim 1, further comprising:
    a first electrostatic discharge unit removing noise on the input data;
    a second electrostatic discharge unit removing noise on the clock; and
    a third electrostatic discharge unit removing noise on the latch output enable signal.

11. The nonvolatile latch circuit of claim 1,
    wherein the storage control unit outputs the control signal when power is applied, and outputs the control signal in response to the data transition detection signal when the delay signal transitions.

12. The nonvolatile latch circuit of claim 1,
    wherein the clock control unit activates and outputs the clock enable signal when the control signal and the clock are simultaneously activated.

13. The nonvolatile latch circuit of claim 1,
    wherein the data transition detecting unit outputs the data transition detection signal as a pulse when a level of the delay signal changes.

14. The nonvolatile latch circuit of claim 1, wherein the data output unit outputs the output data according to the delay signal when the latch output enable signal is at a high level, and outputs the output data as a high impedance status when the latch output enable signal is at a low level.

15. The nonvolatile latch circuit of claim 1 or claim 14,
    wherein the data output unit includes:
    a first pull-up element selectively outputting a power supply voltage according to an inversion signal of the latch output enable signal;
    a second pull-up element outputting a voltage of the first pull-up element as the output data according to the inversion signal of the delay signal;
    a first pull-down element selectively outputting a ground voltage according to the latch output enable signal; and
    a second pull-down element outputting a voltage of the second pull-down element as the output data according to the inversion signal of the delay signal.

16. The nonvolatile latch circuit of claim 1 or claim 14,
    wherein the data output unit includes a switch control unit performing a logic combination of the latch output enable signal and the delay signal to output the output data.

17. The nonvolatile latch circuit of claim 16,
    wherein the switch control unit comprises an AND gate.

18. The nonvolatile latch circuit of claim 16,
    further comprising a switching unit controlling a current that flows in an input/output node according to the output data.

19. The nonvolatile latch circuit of claim 18,
    wherein the switching unit includes a MOS transistor that is connected between a first terminal and a second terminal, and the output data is applied to the gate of the MOS transistor.

20. The nonvolatile latch circuit of claim 18,
    wherein the switching unit comprises a plurality of MOS transistors that are respectively connected between a plurality of first terminals and a plurality of second terminals, and have a common gate configuration applied to the output data.

21. The nonvolatile latch circuit of claim 18,
wherein the switching unit comprises a bipolar junction transistor that is connected between a first terminal and a second terminal, and the output data is applied at the base of the bipolar junction transistor.

22. The nonvolatile latch circuit of claim 18,
wherein the switching unit comprises a plurality of bipolar junction transistors that are respectively connected between a plurality of first terminals and a plurality of second terminals, and the output data are applied to the commonly configured bases of the plurality of the bipolar junction transistors.

23. A nonvolatile latch circuit, comprising,
an input control unit storing and latching an input data as a non-volatile state in a normal state; and
a data output unit selectively outputting a output data according to a latch output enable signal in the normal state,
wherein the nonvolatile latch circuit recovering the output data according to the latch output enable signal and the input data is stored and latched as a non-volatile state in the input control unit when the non-volatile circuit recovers back to the normal state from a power-off state.

* * * * *